US012666770B2

(12) United States Patent
Kim et al.

(10) Patent No.: US 12,666,770 B2
(45) Date of Patent: Jun. 23, 2026

(54) DISPLAY DEVICE

(71) Applicant: Samsung Display Co., LTD., Yongin-si (KR)

(72) Inventors: Dae Hyun Kim, Hwaseong-si (KR); Tae Jin Kong, Hwaseong-si (KR); Ock Soo Son, Seoul (KR); Hyun Min Cho, Seoul (KR); Chang Il Tae, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 491 days.

(21) Appl. No.: 18/020,148

(22) PCT Filed: Jul. 1, 2021

(86) PCT No.: PCT/KR2021/008369
§ 371 (c)(1),
(2) Date: Feb. 7, 2023

(87) PCT Pub. No.: WO2022/030763
PCT Pub. Date: Feb. 10, 2022

(65) Prior Publication Data
US 2024/0038943 A1 Feb. 1, 2024

(30) Foreign Application Priority Data
Aug. 7, 2020 (KR) ........................ 10-2020-0099389

(51) Int. Cl.
H10H 20/851 (2025.01)
H10H 20/831 (2025.01)
H10W 90/00 (2026.01)

(52) U.S. Cl.
CPC .... H10H 20/8514 (2025.01); H10H 20/8312 (2025.01); H10W 90/00 (2026.01)

(58) Field of Classification Search
CPC .............. H01L 25/0753; H10H 20/851; H10H 20/8514; H10H 20/8312; H10H 20/84; H10H 20/8515; H10K 59/38
See application file for complete search history.

(56) References Cited

U.S. PATENT DOCUMENTS

| | | | |
|---|---|---|---|
| 10,916,722 | B2 | 2/2021 | Park et al. |
| 11,004,910 | B2 | 5/2021 | Jung et al. |

(Continued)

FOREIGN PATENT DOCUMENTS

| | | |
|---|---|---|
| KR | 10-2012-0122159 | 11/2012 |
| KR | 10-2015-0006798 | 1/2015 |

(Continued)

OTHER PUBLICATIONS

Mid-infrared optical properties of thin films of aluminum oxide, titanium oxide, silicon dioxide, aluminum nitride, and silicon nitride (Year: 2012).*

(Continued)

*Primary Examiner* — Monica D Harrison
*Assistant Examiner* — Jacob T Nelson
(74) *Attorney, Agent, or Firm* — Womble Bond Dickinson (US) LLP

(57) ABSTRACT

A display device includes: a first substrate including sub-pixels including light emitting areas; first electrodes and second electrodes disposed on the first substrate and spaced apart from each other; light emitting elements disposed on the first substrate and disposed on the first electrodes and the second electrodes in the light emitting areas of the sub-pixels; a color control member disposed on the light emitting elements and including light transmitting layers and wavelength conversion layers; a second substrate facing the first substrate and including light transmitting areas overlapping the sub-pixels; color filter layers disposed on a surface of the (Continued)

ED : ED1, ED2, ED3
CFL : CFL1, CFL2, CFL3
PXn : PX1, PX2, PX3 second substrate facing the first substrate; and a base layer disposed between the first substrate and the second substrate and disposed between at least the wavelength conversion layers and the color filter layers.

19 Claims, 29 Drawing Sheets

(56)                 References Cited

U.S. PATENT DOCUMENTS

| | | | |
|---|---|---|---|
| 11,444,258 | B2 | 9/2022 | Park et al. |
| 11,672,154 | B2 | 6/2023 | Jung et al. |
| 11,903,229 | B2 | 2/2024 | Park et al. |
| 2011/0089850 | A1 | 4/2011 | Shibata et al. |
| 2011/0254043 | A1 | 10/2011 | Negishi et al. |
| 2014/0145237 | A1 | 5/2014 | Do et al. |
| 2019/0013370 | A1 | 1/2019 | Nie |
| 2019/0155110 | A1* | 5/2019 | Lim ................ G02F 1/133711 |
| 2019/0378873 | A1 | 12/2019 | Lee et al. |
| 2020/0043976 | A1* | 2/2020 | Kim .................. H10H 20/856 |
| 2020/0091464 | A1 | 3/2020 | Park et al. |
| 2020/0135811 | A1* | 4/2020 | Jung ...................... G02B 1/10 |
| 2024/0138176 | A1 | 4/2024 | Park et al. |
| 2024/0237386 | A9 | 7/2024 | Park et al. |

FOREIGN PATENT DOCUMENTS

| | | |
|---|---|---|
| KR | 10-2019-0047403 | 5/2019 |
| KR | 10-2020-0001649 | 1/2020 |
| KR | 10-2020-0005692 | 1/2020 |
| KR | 10-2064107 | 1/2020 |
| KR | 10-2020-0016424 | 2/2020 |
| KR | 10-2020-0032294 | 3/2020 |
| KR | 10-2020-0037906 | 4/2020 |
| KR | 10-2020-0047943 | 5/2020 |
| KR | 10-2020-0073340 | 6/2020 |
| KR | 10-2020-0088962 | 7/2020 |

OTHER PUBLICATIONS

International Search Report, with English translation, corresponding to International Application No. PCT/KR2021/008369 dated Oct. 13, 2021.
Extended European Search Report for European Application No. 21853299.2, dated Jun. 14, 2024.

* cited by examiner

10

NDA

PX PX PX
PX PX PX
PX PX PX

DPA

T1 : ACT1, G1, S1, D1

DISPLAY DEVICE

CROSS REFERENCE TO RELATED APPLICATION(S)

This application is a national entry of International Application No. PCT/KR2021/008369, filed on Jul. 1, 2021, which claims under 35 U.S.C. §§ 119(a) and 365 (b) priority to and benefits of Korean Patent Application No. 10-2020-0099389, filed on Aug. 7, 2020, in the Korean Intellectual Property Office (KIPO), the entire content of which are incorporated herein by reference.

BACKGROUND

1. Technical Field

Embodiments relate to a display device.

2. Description of the Related Art

The importance of display devices has steadily increased with the development of multimedia technology. Various types of display devices such as an organic light emitting display (OLED), a liquid crystal display (LCD) and the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) formed of an organic material as a fluorescent material and an inorganic light emitting diode formed of an inorganic material as a fluorescent material.

SUMMARY

Embodiments provide a display device capable of improving light conversion efficiency and color matching rate.

However, embodiments of the disclosure are not limited to those set forth herein. The above and other embodiments will become more apparent to one of ordinary skill in the art to which the disclosure pertains by referencing the detailed description of the disclosure given below.

According to an embodiment, a display device may include: a first substrate including a plurality of sub-pixels including light emitting areas, a plurality of first electrodes and a plurality of second electrodes disposed on the first substrate and spaced apart from each other, a plurality of light emitting elements disposed on the first substrate and disposed on the plurality of first electrodes and the plurality of second electrodes in the light emitting areas of the plurality of sub-pixels, a color control member disposed on the plurality of light emitting elements and including a plurality of light transmitting layers and a plurality of wavelength conversion layers, a second substrate facing the first substrate and including a plurality of light transmitting areas overlapping the plurality of sub-pixels, a plurality of color filter layers disposed on a surface of the second substrate facing the first substrate, and a base layer disposed between the first substrate and the second substrate and disposed between at least the plurality of wavelength conversion layers and the plurality of color filter layers.

The plurality of light emitting elements may include first light emitting elements disposed in a first sub-pixel and second light emitting elements disposed in a second sub-pixel, the color control member may include a light transmitting layer disposed on the first light emitting elements and a first wavelength conversion layer disposed on the second light emitting elements, and the plurality of color filter layers may include a first color filter layer disposed on the light transmitting layer and a second color filter layer disposed on the first wavelength conversion layer.

The light transmitting layer may be directly disposed on the first light emitting elements, the first wavelength conversion layer may be directly disposed on the second light emitting elements, and the base layer may be disposed between the light transmitting layer and the first color filter layer.

The display device may further include a first capping layer disposed on the light transmitting layer and the first wavelength conversion layer, and a second capping layer disposed on a surface of the first color filter layer and a surface of the second color filter layer facing the first substrate, wherein the base layer may be in direct contact with the first capping layer and the second capping layer.

The base layer may include a low refractive material having a refractive index lower than a refractive index of the first capping layer, and the display device may further include a spacer disposed at a boundary area between some of the plurality of sub-pixels and disposed between the first substrate and the second substrate.

The spacer may be in direct contact with the first capping layer and the second capping layer.

The light transmitting layer may be disposed on a surface of the first color filter layer facing the first substrate, and the base layer may be disposed between the light transmitting layer and the first light emitting elements.

The display device may further include a third capping layer disposed on a surface of the light transmitting layer facing the first substrate.

The plurality of light emitting elements may emit light of a first color, and the first wavelength conversion layer may convert the light of the first color emitted from the plurality of light emitting elements into light of a second color different from the first color.

The plurality of light emitting elements may further include third light emitting elements disposed in a third sub-pixel, the color control member may further include a second wavelength conversion layer directly disposed on the third light emitting elements, the color filter layers may further include a third color filter layer disposed on the second wavelength conversion layer, and the second wavelength conversion layer may convert the light emitted from the third light emitting elements into light of a third color different from the first color and the second color.

The display device may further include a plurality of first banks disposed in boundary areas between the plurality of sub-pixels and disposed and spaced apart from each other in the light emitting areas and a second bank disposed at the boundary areas between the plurality of sub-pixels and partially disposed on the plurality of first banks, wherein the plurality of first electrodes and the plurality of second electrodes may be disposed on different first banks, respectively.

The display device may further include a first light blocking member disposed between the plurality of light transmitting layers and the plurality of wavelength conversion layers and a second light blocking member disposed on the surface of the second substrate and disposed between the color filter layers, wherein the first light blocking member and the second light blocking member may overlap the second bank in a thickness direction.

The display device may further include a third bank disposed on the second bank and a first capping layer disposed on the third bank and the color control members.

The display device may further include a first insulating layer disposed on the plurality of first electrodes and the plurality of second electrodes, a first contact electrode in contact with end portions of the plurality of light emitting elements and the plurality of first electrodes, and a second contact electrode in contact with other end portions of the plurality of light emitting elements and the plurality of second electrodes, wherein the plurality of light emitting elements may be directly disposed on the first insulating layer.

According to an embodiment, a display device may include: a first substrate including a plurality of sub-pixels including light emitting areas, the plurality of sub-pixels including a first sub-pixel and a second sub-pixel, a first electrode and a second electrode disposed in each of the plurality of sub-pixels on the first substrate and spaced apart from each other, first light emitting elements disposed on the first electrode and the second electrode of the first sub-pixel and second light emitting elements disposed on the first electrode and the second electrode of the second sub-pixel, a light transmitting layer directly disposed on the first light emitting elements and a first wavelength conversion layer directly disposed on the second light emitting elements, a first capping layer covering the light transmitting layer and the first wavelength conversion layer, a second substrate facing the first substrate and including a first light transmitting area overlapping the first sub-pixel and a second light transmitting area overlapping the second sub-pixel, a first light blocking member disposed on a surface of the second substrate facing the first substrate and disposed between the first light transmitting area and the second light transmitting area, a first color filter layer disposed on the surface of the second substrate in the first light transmitting area and a second color filter layer disposed on the surface of the second substrate in the second light transmitting area, a second capping layer covering the first color filter layer, the second color filter layer, and the light blocking member, and a base layer disposed between the first capping layer and the second capping layer.

The display device may further include a plurality of first banks disposed in adjacent sub-pixels on the first substrate and spaced apart from each other in the light emitting areas and a second bank disposed at a boundary area between the adjacent sub-pixels and surrounding the light emitting areas, wherein the light transmitting layer and the first wavelength conversion layer may be disposed in areas surrounded by the second bank.

The first capping layer may be directly disposed on the second bank.

The display device may further include a second light blocking member directly disposed on a portion of the first capping layer disposed on the second bank and disposed between the light transmitting layer and the first wavelength conversion layer.

The second bank and the first light blocking member may overlap each other in a thickness direction.

The base layer may include a low refractive material having a refractive index lower than a refractive index of the first capping layer, and the display device may further include a spacer disposed at a boundary area between some of the plurality of sub-pixels and disposed to be in direct contact with the first capping layer and the second capping layer between the first substrate and the second substrate.

In a display device according to an embodiment, a light emitting display device may be implemented to include a display substrate on which light emitting elements and a color control member are disposed and a color filter substrate on which a color filter layer is disposed. In the display device, the light emitting elements and the color control member may be disposed adjacent to each other on the same substrate, and accordingly, emission efficiency and a color gamut may be excellent.

In the display device according to an embodiment, the color control member may be manufactured on a substrate different from that of the color filter layer. Thus, the color control member may be protected from being damaged in a thermal process for forming the color filter layer.

The effects according to the embodiments are not limited by the contents described above, and more various effects are included in this disclosure.

BRIEF DESCRIPTION OF THE DRAWINGS

FIG. 4 is a schematic cross-sectional view illustrating a pixel of the display device according to an embodiment;

FIGS. 7 to 17 are schematic cross-sectional views sequentially illustrating processes of manufacturing the display device according to an embodiment;

FIG. 18 is a schematic cross-sectional view illustrating a pixel of a display device according to an embodiment;

FIG. 19 is a schematic cross-sectional view illustrating a pixel of a display device according to an embodiment;

FIGS. 20 to 22 are schematic cross-sectional views sequentially illustrating some of processes of manufacturing the display device of FIG. 19;

FIG. 25 is a schematic cross-sectional view illustrating a pixel of a display device according to an embodiment;

FIGS. 26 and 27 are schematic cross-sectional views sequentially illustrating some of processes of manufacturing the display device of FIG. 25; and FIGS. 28 and 29 are schematic cross-sectional views illustrating a pixel of a display device according to an embodiment.

DETAILED DESCRIPTION OF THE EMBODIMENTS

Figure 1:
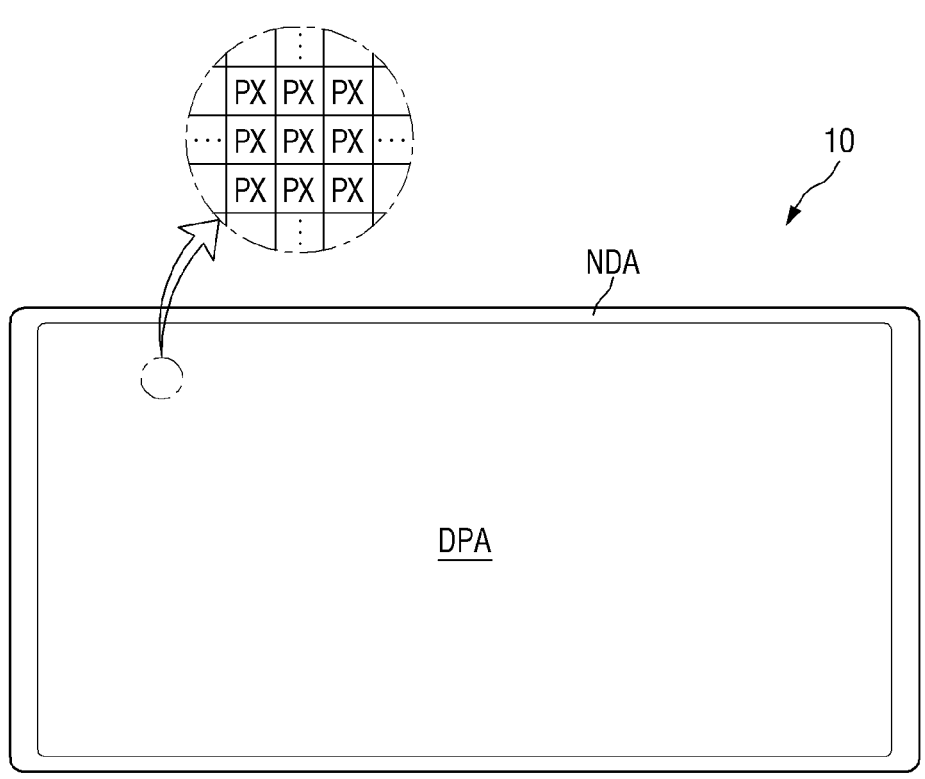
FIG. 1 is a schematic plan view of a display device according to an embodiment.
Figure 1:
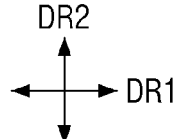

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, embodiments will be described with reference to the accompanying drawings.

FIG. 1 is a schematic plan view of a display device according to an embodiment.

Referring to FIG. 1, a display device 10 may display a moving image or a still image. The display device 10 may include all electronic devices that provide display screens. For example, the display device 10 may include televisions, laptop computers, monitors, billboards, the Internet of Things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras, camcorders, and the like, which provide display screens.

The display device 10 may include a display panel providing the display screen. Examples of the display panel may include an inorganic light emitting diode display panel, an organic light emitting display panel, a quantum dot light emitting display panel, a plasma display panel, a field emission display panel, and the like. Hereinafter, a case where an inorganic light emitting diode display panel is applied as an example of the display panel will be described as an example, but embodiments are not limited thereto.

A shape of the display device 10 may be variously modified. For example, the display device 10 may have a shape such as a rectangular shape with a width greater than a length, a rectangular shape with a length greater than a width, a square shape, a rectangular shape with rounded corners (e.g., vertices), other polygonal shapes, or a circular shape. A shape of a display area DPA of the display device 10 may also be similar to an overall shape of the display device 10. In FIG. 1, the display device 10 and the display area DPA having the rectangular shape with the width greater than the length are illustrated.

The display device 10 may include the display area DPA and non-display areas NDA. The display area DPA may be an area in which a screen may be displayed, and the non-display area NDA may be an area in which the screen is not displayed. The display area DPA may also be referred to as an active area, and the non-display area NDA may also be referred to as a non-active area. The display area DPA may cover the center area of the display device 10.

The display area DPA may include pixels PX. The pixels PX may be arranged in a matrix pattern. A shape of each pixel PX may be a rectangular shape or a square shape in plan view, but embodiment are not limited thereto, and may also be a rhombic shape of which each side is inclined with respect to a direction. For example, each of the pixels PX may include one or more light emitting elements ED emitting light of a specific wavelength band to display a specific color.

The non-display areas NDA may be disposed around the display area DPA. The non-display areas NDA may entirely or partially surround the display area DPA. The display area DPA may have a rectangular shape, and the non-display areas NDA may be disposed adjacent to four sides of the display area DPA. The non-display areas NDA may include a bezel of the display device 10. Lines or circuit drivers included in the display device 10 may be disposed, or external devices may be mounted, in each of the non-display areas NDA.

Figure 2:
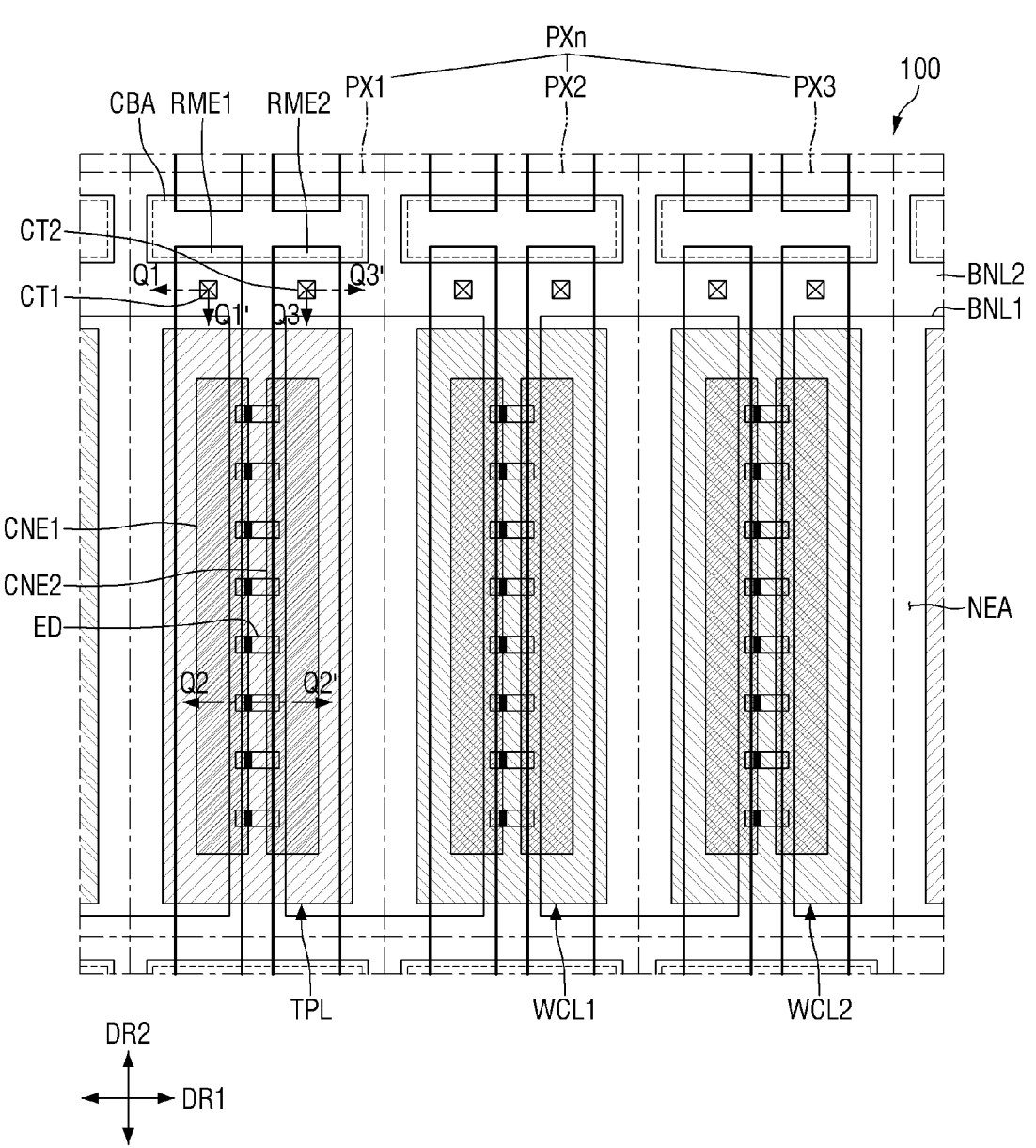
FIG. 2 is a schematic plan view illustrating a pixel of a first display substrate according to an embodiment.
Figure 3:
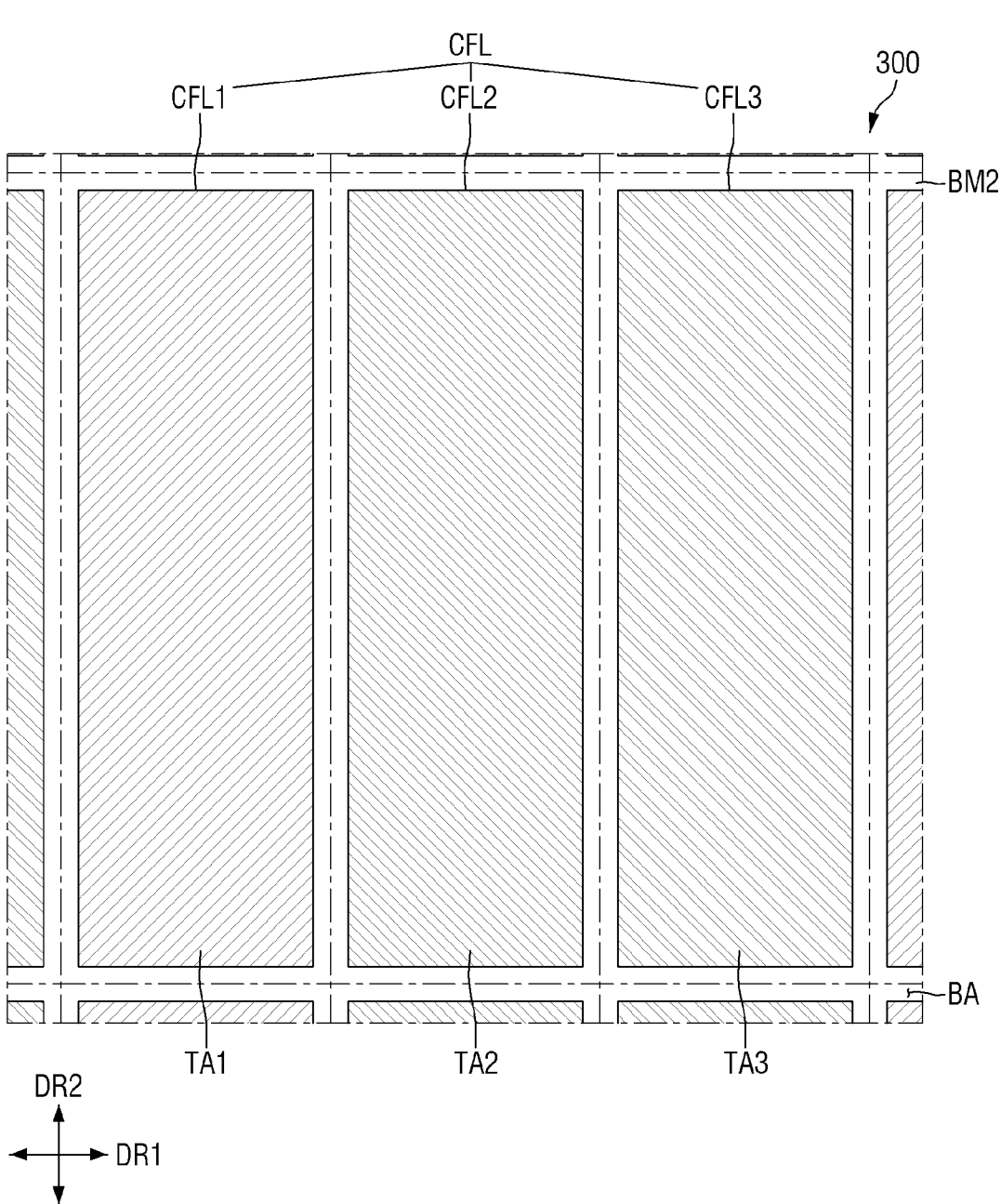
FIG. 3 is a schematic plan view illustrating a pixel of a second display substrate according to an embodiment.
Figure 4:
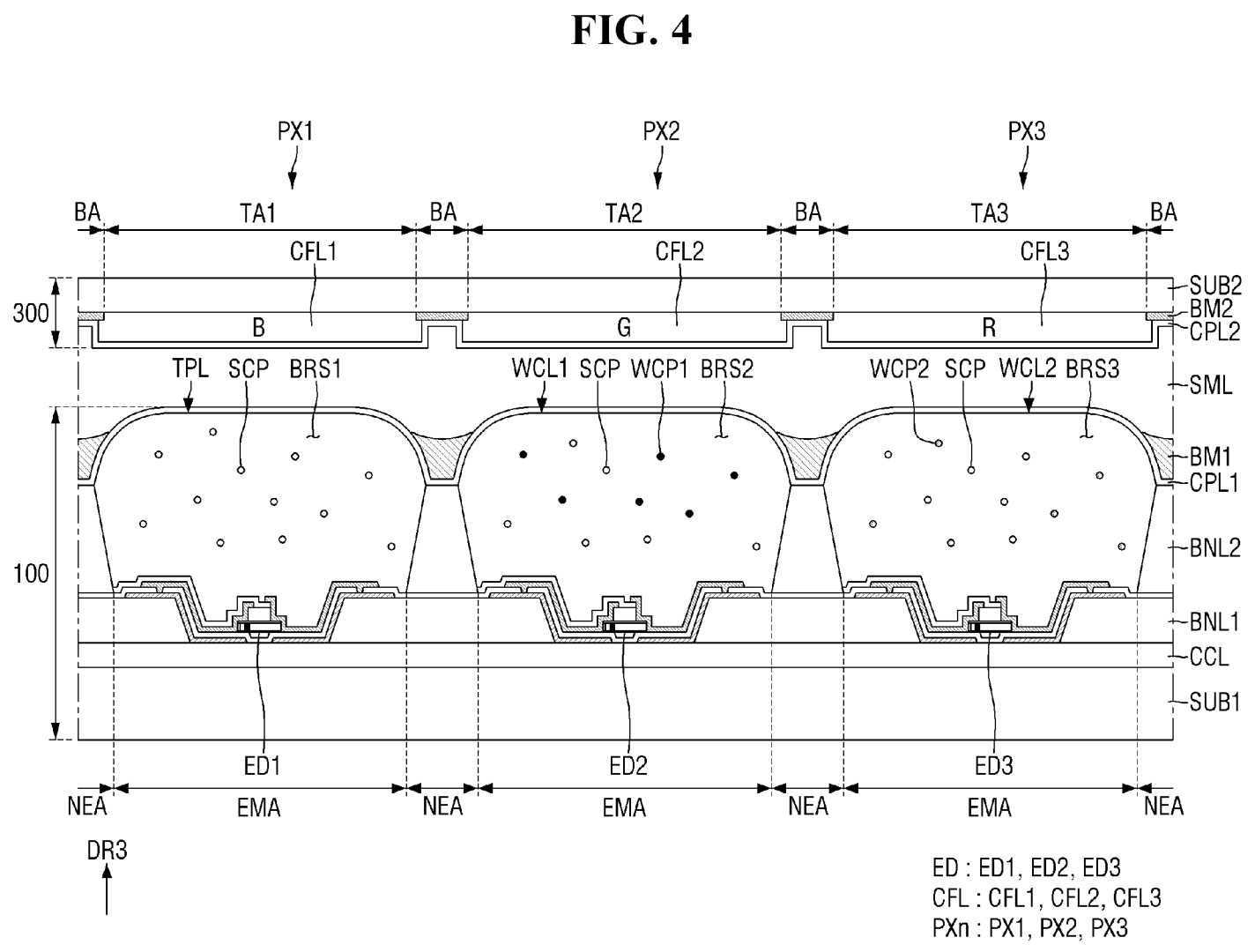
Figure 5:
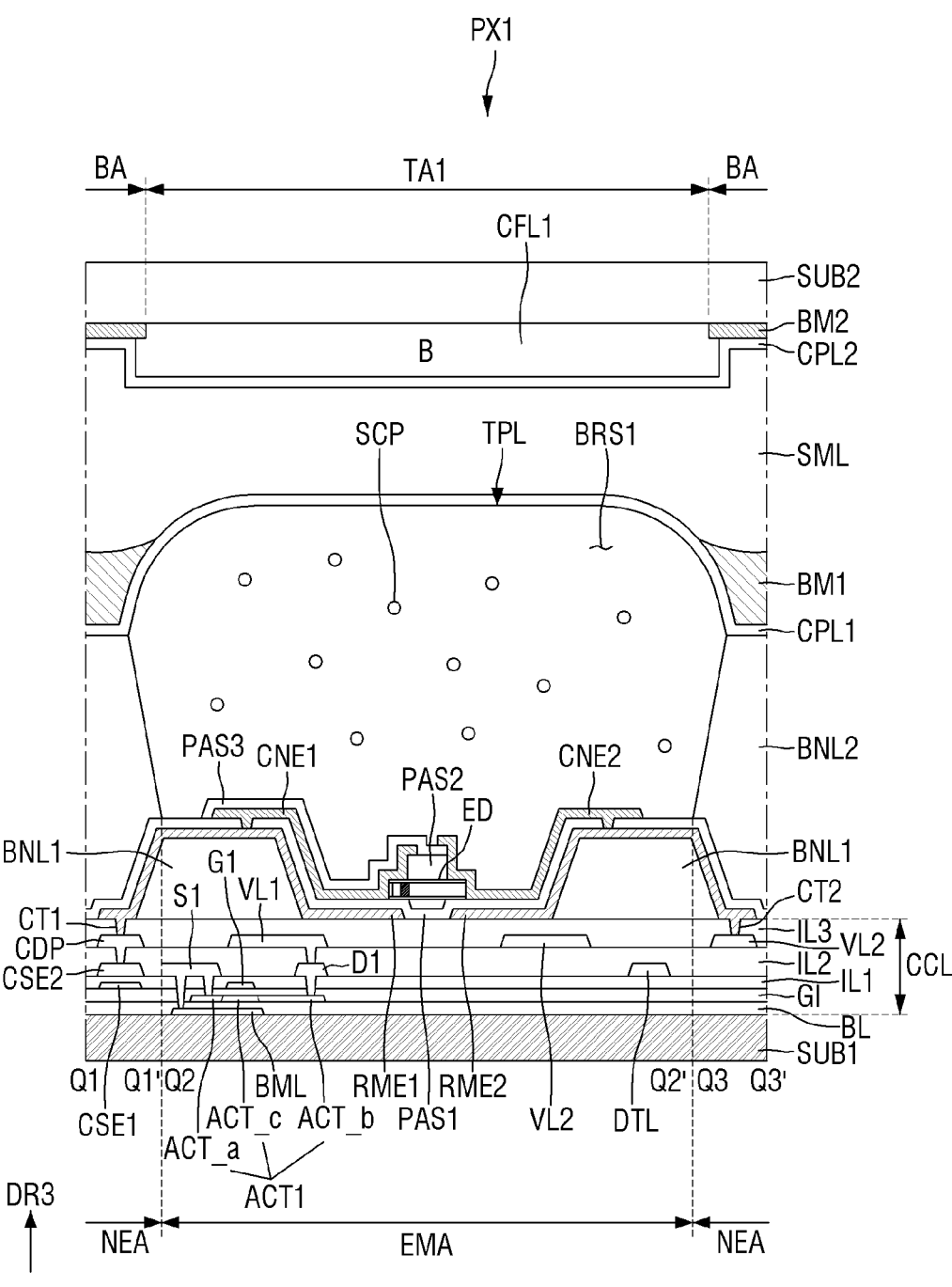
FIG. 5 is a schematic cross-sectional view taken along lines Q1-Q1', Q2-Q2', and Q3-Q3' of FIG. 2.

FIG. 2 is a schematic plan view illustrating a pixel of a first display substrate according to an embodiment. FIG. 3 is a schematic plan view illustrating a pixel of a second display substrate according to an embodiment. FIG. 4 is a schematic cross-sectional view illustrating a pixel of the display device according to an embodiment. FIG. 5 is a cross-sectional view taken along lines Q1-Q1', Q2-Q2', and Q3-Q3' of FIG. 2.

FIG. 2 illustrates a schematic layout of light emitting elements ED and color control members TPL, WCL1, and WCL2 based on a second bank BNL2 disposed in a first display substrate 100 of the display device 10, and FIG. 3 illustrates a schematic layout of a second light blocking member BM2 and a color filter layer CFL (e.g., CFL1, CFL2, and CFL3) disposed in a second display substrate 300. FIG. 4 illustrates a cross-section of a pixel of the display device 10, and FIG. 5 illustrates cross-sections of the first display substrate 100 and the second display substrate 300 take along lines Q1-Q1', Q2-Q2', and Q3-Q3' of FIG. 2.

Referring to FIGS. 2 to 5, each of the pixels PX may include sub-pixels PXn (here, n is an integer of 1 to 3). For example, a pixel PX may include a first sub-pixel PX1, a second sub-pixel PX2, and a third sub-pixel PX3. The first sub-pixel PX1 may display light of a first color, the second sub-pixel PX2 may display light of a second color, and the third sub-pixel PX3 may display light of a third color. The first color may be blue, the second color may be green, and the third color may be red. However, embodiments are not limited thereto. It is illustrated in FIGS. 2 and 3 that the pixel PX includes three sub-pixels PXn, but embodiments are not limited thereto, and the pixel PX may include a larger number of sub-pixels PXn.

According to an embodiment, the display device 10 may include the first display substrate 100 and the second display substrate 300 disposed to face each other. The first display substrate 100 may include light emitting elements ED (e.g., ED1, ED2, and ED3) and color control members TPL, WCL1, and WCL2 disposed on a first substrate SUB1, and the second display substrate 300 may include a color filter layer CFL disposed on a surface of a second substrate SUB2. The light emitting elements ED may emit light of specific wavelength bands, and the light emitted from the light emitting elements ED may pass through the color control members TPL, WCL1, and WCL2 and the color filter layer CFL and be emitted through another surface of the second substrate SUB2.

The first display substrate 100 may include light emitting areas EMA and non-light emitting areas NEA The light emitting area EMA may be an area in which the light emitting elements ED are disposed to emit light of a specific wavelength band, and the non-light emitting area NEA may be an area in which the light emitting elements are not disposed and the light does not transmit and thus, is not emitted.

For example, each sub-pixel PXn may include a sub-area CBA disposed on a side of the light emitting area EMA in a second direction DR2. The sub-area CBA may be disposed between light emitting areas EMA of sub-pixels PXn neighboring to each other in the second direction DR2. For example, light emitting areas EMA and sub-areas CBA may be arranged in the first display substrate 100. For example, the light emitting areas EMA and sub-areas CBA may be repeatedly arranged in a first direction DR1, respectively, and the light emitting areas EMA and the sub-areas CBA may be alternately arranged in the second direction DR2 The second bank BNL2 may be disposed between the sub-areas CBA and the light emitting areas EMA, and distances between the sub-areas CBA and the light emitting areas EMA may change according to a width of the second bank BNL2. Light may not be emitted in the sub-areas CBA as the light emitting elements ED are not disposed in the sub-areas CBA, but portions of electrodes RME1 and RME2 of the first display substrate 100 may be disposed in the sub-areas CBA. The electrodes RME1 and RME2 disposed for some sub-pixels PXn may be separated from each other in the sub-area CBA. However, embodiments are not limited thereto, and the respective electrodes RME1 and RME2 may be disposed in a state in which they are not separated from the sub-area CBA The first display substrate 100 will be described in detail. The first substrate SUB1 may be an insulating substrate. The first substrate SUB1 may be made of a transparent insulating material such as glass, quartz, or a polymer resin. For example, the first substrate SUB1 may be a rigid substrate, but may also be a flexible substrate that is bendable, foldable, or rollable.

A circuit layer CCL may be disposed on the first substrate SUB1. The circuit layer CCL may include a lower metal layer, a semiconductor layer, a first gate conductive layer, a first conductive layer, and a second conductive layer, and interlayer insulating layers each disposed between these layers. It is illustrated in the drawing that a single first transistor T1 and storage capacitor and some lines are disposed in the circuit layer CCL, but embodiments are not limited thereto. The circuit layer CCL of the display device 10 may include a larger number of transistors in addition to the first transistor T1 by including more lines, electrodes, and semiconductor layers. For example, the display device 10 may also include two or three transistors by including one or more transistors in addition to the first transistor T1 for each sub-pixel PXn.

A lower metal layer BML may be disposed on the first substrate SUB1. The lower metal layer BML may overlap an active layer ACT1 of the first transistor T1 of the display device 10. The lower metal layer BML may include a material blocking light to prevent the light from being incident on the active layer ACT1 of the first transistor. As an example, the lower metal layer BML may be made of an opaque metal material blocking transmission of the light. However, embodiments are not limited thereto, and in some cases, the lower metal layer BML may be omitted.

A buffer layer BL may be entirely disposed on the lower metal layer and the first substrate SUB1. For example, the buffer layer BL may cover upper surfaces of the lower metal layer BML and the first substrate SUB1. The buffer layer BL may be formed on the first substrate SUB1 in order to protect the first transistors T1 of the pixels PX from moisture permeating through the first substrate SUB1 vulnerable to moisture permeation, and may perform a surface planarization function.

The semiconductor layer may be disposed on the buffer layer BL The semiconductor layer may include the active layer ACT1 of the first transistor T1. The active layer ACT1 may partially overlap a gate electrode G1 or the like of a first gate conductive layer to be described below.

In an embodiment, the semiconductor layer may include polycrystalline silicon, single crystal silicon, an oxide semiconductor, or the like. In case that the semiconductor layer includes the oxide semiconductor, each active layer ACT1 may include conductive regions ACT_a and ACT_b and a channel region ACT_c between the conductive regions ACT_a and ACT_b. The oxide semiconductor may be an oxide semiconductor containing indium (In).

In some embodiments, the oxide semiconductor may be indium tin oxide (ITO), indium zinc oxide (IZO), indium gallium oxide (IGO), indium zinc tin oxide (IZTO), indium gallium zinc oxide (IGZO), indium gallium tin oxide (IGTO), indium gallium zinc tin oxide (IGZTO), or the like.

In another example, the semiconductor layer may include polycrystalline silicon. The polycrystalline silicon may be formed by crystallizing amorphous silicon. For example, each of the conductive regions of the active layer ACT1 may be a doped region doped with impurities.

A first gate insulating layer G1 may be disposed on the semiconductor layer and the buffer layer BL. For example, the first gate insulating layer G1 may cover upper surfaces of the semiconductor layer and the buffer layer BL. The first gate insulating layer G1 may function as a gate insulating film of each of the transistors.

The first gate conductive layer may be disposed on the first gate insulating layer G1. The first gate conductive layer may include a gate electrode G1 of the first transistor T1 and a first capacitance electrode CSE1 of a storage capacitor.

The gate electrode G1 may overlap the channel region ACT_c of the active layer ACT1 in a thickness direction. The first capacitance electrode CSE1 may overlap a second capacitance electrode CSE2 to be described below in the thickness direction. In some embodiments, the first capacitance electrode CSE1 may be connected to and may be integral with the gate electrode G1. The first capacitance electrode CSE1 may overlap the second capacitance electrode CSE2 in the thickness direction, and the storage capacitor may be formed between the first capacitance electrode CSE1 and the second capacitance electrode CSE2.

The first gate conductive layer may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof. However, embodiments are not limited thereto.

A first interlayer insulating layer IL1 may be disposed on the first gate conductive layer. The first interlayer insulating layer IL1 may cover the first gate conductive layer, and may function to protect the first gate conductive layer.

The first conductive layer may be disposed on the first interlayer insulating layer IL1. The first conductive layer may include a first drain electrode D1 and a first source electrode S1 of the first transistor T1, a data line DTL, and the second capacitance electrode CSE2.

The first drain electrode D1 and the first source electrode S1 of the first transistor T1 may be in contact with the conductive regions ACT_a and ACT_b of the active layer ACT1, respectively, through contact holes penetrating through the first gate insulating layer G1. For example, the first source electrode S1 of the first transistor T1 may be connected (e.g., electrically connected) to the lower metal layer BML through another contact hole.

The data line DTL may apply a data signal to another transistor included in the display device 10. For example, the data line DTL may be connected to source/drain electrodes of another transistor to transfer a signal applied from the data line DTL.

The second capacitance electrode CSE2 may overlap the first capacitance electrode CSE1 in the thickness direction. In some embodiments, the second capacitance electrode CSE2 may be connected to and may be integral with the first source electrode S1.

The first conductive layer may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof. However, embodiments are not limited thereto.

A second interlayer insulating layer IL2 may be disposed on the first conductive layer. The second interlayer insulating layer IL2 may function as an insulating film between the first conductive layer and other layers disposed above the first conductive layer. For example, the second interlayer insulating layer IL2 may cover the first conductive layer, and function to protect the first conductive layer.

The second conductive layer may be disposed on the second interlayer insulating layer IL2 The second conductive layer may include a first voltage line VL1, a second voltage line VL2, and a first conductive pattern layer CDP. A high potential voltage (or a first source voltage) supplied to the first transistor T1 may be applied to the first voltage line VL1, and a low potential voltage (or a second source voltage) supplied to a second electrode RME2 may be applied to the second voltage line VL2. For example, an alignment signal necessary for aligning the light emitting elements ED may be applied to the second voltage line VL2 in processes of manufacturing the display device 10.

The first conductive pattern layer CDP may be connected to the second capacitance electrode CSE2 through a contact hole formed in the second interlayer insulating layer IL2. However, as described above, the second capacitance electrode CSE2 may be integral with the first source electrode S1 of the first transistor T1, and the first conductive pattern layer CDP may be connected (e.g., electrically connected) to the first source electrode S1. The first conductive pattern layer CDP may also be in contact with a first electrode RME1 to be described below, and the first transistor T1 may transfer the first source voltage applied from the first voltage line VL1 to the first electrode RME1 through the first conductive pattern layer CDP. It is illustrated in the drawing that the second conductive layer includes a second voltage line VL2 and a first voltage line VL1, but embodiments are not limited thereto. The second conductive layer may include a larger number of first voltage lines VL1 and second voltage lines VL2.

The second conductive layer may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof. However, embodiments are not limited thereto.

Each of the buffer layer BL, the first gate insulating layer G1, the first interlayer insulating layer IL1, and the second interlayer insulating layer IL2 described above may be formed as a single layer or inorganic layers in which layers are stacked or the layers are alternately stacked. For example, each of the buffer layer BL, the first gate insulating layer GI, the first interlayer insulating layer IL1, and the second interlayer insulating layer IL2 may be formed as multiple layers in which inorganic layers including at least one of silicon oxide ($SiO_x$), silicon nitride ($SiN_x$), and silicon oxynitride ($SiO_xN_y$) are alternately stacked or a double layer in which silicon oxide ($SiO_x$) and silicon nitride ($SiN_x$) are sequentially stacked.

A third interlayer insulating layer IL3 may be disposed on the second conductive layer. The third interlayer insulating layer IL3 may include an organic insulating material, for example, an organic material such as polyimide (PI), and perform a surface planarization function. However, in some embodiments, the third interlayer insulating layer IL3 may be omitted.

The light emitting elements ED, first banks BNL1, and the second bank BNL2 may be disposed on the third interlayer insulating layer IL3. The second bank BNL2 may be disposed at boundary areas between the sub-pixels PXn or disposed between the light emitting area EMA and the sub-area CBA, and the light emitting elements ED, electrodes RME1 and RME2, and contact electrode CNE1 and CNE2 may be disposed in an area surrounded by the second bank BNL2.

First banks BNL1 may be disposed (e.g., directly disposed) on the third interlayer insulating layer IL3. A first bank BNL1 may have a shape extending in the first direction DR1, and may be disposed across other sub-pixels PXn neighboring to each other. For example, the first bank BNL1 may have a shape extending in the second direction DR2, and may be disposed in the light emitting area EMA of each sub-pixel PXn so as not to be disposed in sub-pixels PXn neighboring to each sub-pixel PXn in the second direction DR2. For example, each of the first banks BNL1 may b have a certain width in the first direction DR1, such that a portion of each of the first banks BNL1 may be disposed in the light emitting area EMA and another portion thereof may be disposed at a boundary area between the sub-pixel PXn neighboring to each other in the first direction DR1. For example, a length of each of the first banks BNL1 measured in the second direction DR2 may be greater than a length of the light emitting area EMA measured in the second direction DR2, such that a portion of each of the first banks BNL1 may overlap the second bank BNL2 in the non-light emitting area NEA.

According to an embodiment, first banks BNL1 may be disposed in a single sub-pixel PXn. For example, in the single sub-pixel PXn, two first banks BNL1 may be partially disposed in the light emitting area EMA. The two first banks BNL1 may be spaced apart from each other in the first direction DR1. The light emitting elements ED may be disposed between the first banks BNL1 spaced apart from each other in the first direction DR1. It is illustrated in the drawing that two first banks BNL1 are disposed in the light emitting area EMA of each sub-pixel PXn to form an island-shaped pattern over the entirety of the first display substrate 100, but embodiments are not limited thereto. The number of first banks BNL1 disposed in the light emitting area EMA of each sub-pixel PXn may be modified according to the number of electrodes RME1 and RME2 or an arrangement of the light emitting elements ED.

The first bank BNL1 may have a structure in which at least a portion thereof protrudes from an upper surface of the third interlayer insulating layer IL3. The protruding portion of the first bank BNL1 may have inclined side surfaces, and the light emitted from the light emitting elements ED may be reflected from the electrodes RME1 and RME2 disposed on the first bank BNL1 and emitted in an upward direction (e.g., third direction DR3) of the third interlayer insulating layer IL3. The first bank BNL1 may function as a reflective wall reflecting the light emitted from the light emitting elements ED toward the upward direction (e.g., third direction DR3) with providing an area in which the light emitting elements ED are disposed. The side surfaces of the first banks BNL1 may be inclined in a linear shape, but embodiments are not limited thereto, and the first banks BNL1 may also have a semi-circular shape or a semi-elliptical shape with curved outer surfaces. The first banks BNL1 may include an organic insulating material such as polyimide (PI), but embodiments are not limited thereto.

The electrodes RME1 and RME2 may have a shape extending in a direction, and are disposed in each sub-pixel PXn. The electrodes RME1 and RME2 may have a shape extending in the second direction DR2, and may be disposed in each sub-pixel PXn so as to be spaced apart from each other in the first direction DR1 or the second direction DR2.

For example, a first electrode RME1 and a second electrode RME2 spaced apart from the first electrode RME1 in the first direction DR1 may be disposed in each sub-pixel PXn. Light emitting elements ED may be disposed on the first electrode RME1 and the second electrode RME2.

However, embodiments are not limited thereto, and positions of the electrodes RME1 and RME2 disposed in each sub-pixel PXn may change according to the number of electrodes RME1 and RME2 or the number of light emitting elements ED disposed in each sub-pixel PXn.

The first electrode RME1 and the second electrode RME2 may be disposed in the light emitting area EMA of each sub-pixel PXn, and portions of the first electrode RME1 and the second electrode RME2 may overlap the second bank BNL2 in the thickness direction beyond the light emitting area EMA. The electrodes RME1 and RME2 may extend in the second direction DR2 within the sub-pixel PXn, and may be spaced apart from electrodes RME1 and RME2 of other sub-pixel PXn in the second direction DR2 in the light emitting area EMA or the sub-area CBA.

Such an arrangement of the electrodes RME1 and RME2 may be implemented by forming electrode lines extending in the second direction DR2, disposing the light emitting elements ED, and separating the electrode lines from each other in a subsequent process. The electrode lines may be used to generate an electric field in the sub-pixel PXn in order to align (or arrange) the light emitting elements ED in the processes of manufacturing the display device 10. The light emitting elements ED may be jetted (e.g., injected or sprayed) onto the electrode lines through an inkjet printing process, and in case that ink including the light emitting element ED is jetted onto the electrode lines, an alignment signal may be applied to the electrode lines to generate an electric field. The light emitting element ED may be disposed on the electrodes by the electric field formed between the electrode lines. The light emitting elements ED dispersed in the ink may be aligned on the electrodes RME by receiving a dielectrophoretic force by the generated electric field. The electrodes RME1 and RME2 may be formed by aligning (or arranging) the light emitting elements ED and disconnecting portions of the electrode lines. For example, signals for emitting light from the light emitting elements ED may be applied to the electrodes RME1 and RME2.

The electrodes RME1 and RME2 disposed in each sub-pixel PXn may be disposed on the first banks BNL1 spaced apart from each other. The respective electrodes RME1 and RME2 may be disposed on sides of the first banks BNL1 in the first direction DR1 and disposed on the inclined side surfaces of the first banks BNL1. In an embodiment, a width of each of the electrodes RME1 and RME2 measured in the first direction DR1 may be smaller than a width of each of the first banks BNL1 measured in the first direction DR1. Each of the electrodes RME1 and RME2 may cover at least one side surface of the first bank BNL1 to reflect the light emitted from the light emitting elements ED.

For example, a distance between the electrodes RME1 and RME2 spaced apart from each other in the first direction DR1 may be smaller than a distance between the first banks BNL1. At least partial areas of the respective electrodes RME1 and RME2 may be disposed (e.g., directly disposed) on the third interlayer insulating layer IL3, such that the respective electrodes RME1 and RME2 may be disposed on the same plane.

The electrodes RME1 and RME2 may be connected (e.g., electrically connected) to the light emitting elements ED. For example, the electrodes RME1 and RME2 may be connected to the second conductive layer, such that the signals for emitting light from the light emitting elements ED may be applied to the electrodes RME1 and RME2. The first electrode RME1 may be connected (e.g., electrically connected) to the second conductive layer through a first contact hole CT1, and the second electrode RME2 may be connected (e.g., electrically connected) to the second conductive layer through a second contact hole CT2. For example, the first electrode RME1 may be in contact with the first conductive pattern layer CDP through the first contact hole CT1 formed in an area overlapping the second bank BNL2. The second electrode RME2 may be in contact with the second voltage line VL2 through the second contact hole CT2 formed in an area overlapping the second bank BNL2. The first electrode RME1 may be connected (e.g., electrically connected) to the first transistor T1 through the first conductive pattern layer CDP to receive the first source voltage applied thereto, and the second electrode RME2 may receive the second source voltage applied thereto through the second voltage line VL2. The first source voltage and the second source voltage may be transferred to the light emitting elements ED through the first electrode RME1 and the second electrode RME2, respectively. Since the first electrodes RME1 are separated for each sub-pixel PXn, the light emitting elements ED of different sub-pixels PXn may emit light individually.

It is illustrated in the drawing that the first contact hole CT1 and the second contact hole CT2 are formed at positions overlapping the second bank BNL2, but embodiments are not limited thereto, positions of the first contact hole CT1 and the second hole CT2 may be variously modified. For example, the first contact hole CT1 and the second contact hole CT2 may be positioned in the light emitting area EMA surrounded by the second bank BNL2, and in some embodiments, a larger number of contact holes may be formed.

Each of the electrodes RME1 and RME2 may include a conductive material having high reflectivity. For example, each of the electrodes RME1 and RME2 may include a metal such as silver (Ag), copper (Cu), or aluminum (Al), or include an alloy including aluminum (Al), nickel (Ni), lanthanum (La), or the like, as the material having the high reflectivity Each of the electrodes RME1 and RME2 may reflect the light emitted from the light emitting elements ED and transmitting toward the side surfaces of the first bank BNL1 in an upward direction (e.g., third direction DR3) of each sub-pixel PXn.

However, embodiments are not limited thereto, and each of the electrodes RME1 and RME2 may further include a transparent conductive material. For example, each of the electrodes RME1 and RME2 may include a material such as ITO, IZO, or ITZO. In some embodiments, each of the electrodes RME may have a structure in which one or more layers made of a transparent conductive material and one or more layers made of a metal having high reflectivity are stacked or may be formed as a single layer including the transparent conductive material and the metal having the high reflectivity. For example, each of the electrodes RME1 and RME2 may have a stacked structure such as ITO/Ag/ ITO, ITO/Ag/IZO, or ITO/Ag/ITZO/IZO.

The electrodes RME1 and RME2 may be connected (e.g., electrically connected) to the light emitting elements ED, and may receive a certain voltage applied thereto so that the light emitting elements ED emit the light. For example, the electrodes RME1 and RME2 may be connected (e.g., electrically connected) to the light emitting elements ED through contact electrodes CNE1 and CNE2 to be described below, and electrical signals applied to the electrodes RME1 and RME2 may be transferred to the light emitting elements ED through the contact electrodes CNE1 and CNE2.

A first insulating layer PAS1 may be disposed on the electrodes RME1 and RME2 and the first banks BNL1. The first insulating layer PAS1 may cover the first banks BNL1, the first electrode RME1, and the second electrode RME2, but may expose portions of upper surfaces of the first electrode RME1 and the second electrode RME2. For example, the first insulating layer PAS1 may be substantially entirely disposed on the third interlayer insulating layer IL3, but may include openings partially exposing the first electrode RME1 and the second electrode RME2.

In an embodiment, the first insulating layer PAS1 may have a step so that a portion of an upper surface thereof may be recessed between the first electrode RME1 and the second electrode RME2 The first insulating layer PAS1 may cover the first electrode RME1 and the second electrode RME2, and accordingly, may be stepped between the first electrode RME1 and the second electrode RME2. However, embodiments are not limited thereto. The first insulating layer PAS1 may insulate the first electrode RME1 and the second electrode RME2 from each other, and may protect the first electrode RME1 and the second electrode RME2. For example, the first insulating layer PAS1 may prevent the light emitting element ED disposed on the first insulating layer PAS1 from being in direct contact with and being damaged by other members.

The second bank BNL2 may be disposed on the first insulating layer PAS1. The second bank BNL2 may be disposed in a lattice-shaped pattern over the entirety of the first display substrate 100 by including portions extending in the first direction DR1 and the second direction DR2 in plan view. The second bank BNL2 may be disposed across a boundary area between the respective sub-pixels PXn to divide neighboring sub-pixels PXn. For example, the second bank BNL2 may surround the light emitting area EMA and the sub-area CBA disposed in each sub-pixel PXn to divide the light emitting area EMA and the sub-area CBA A portion disposed between the light emitting areas EMA in a portion of the second bank BNL2 extending in the second direction DR2 may have a greater width than a portion disposed between the sub-areas CBA. Accordingly, a distance between the sub-areas CBA may be smaller than a distance between the light emitting areas EMA.

The second bank BNL2 may have a greater height than the first bank BNL1. The second bank BNL2 may prevent inks from overflowing into adjacent sub-pixels PXn in an inkjet printing process of the processes of manufacturing the display device 10 to separate inks in which different light emitting elements ED are dispersed for each of different sub-pixels PXn from each other so that these inks may not be mixed with each other. For example, the second bank BNL2 may prevent materials of the color control members TPL, WCL1, and WCL2 from overflowing into other sub-pixels PXn A first bank BNL1 may be disposed across the sub-pixels PXn neighboring to each other in the first direction DR1, and accordingly, a portion of the second bank BNL2 extending in the second direction DR2 may be disposed on the first bank BNL1 The second bank BNL2 may include polyimide (PI) like the first bank BNL1, but embodiments are not limited thereto.

The light emitting elements ED may be disposed on the first insulating layer PAS1. The light emitting elements ED may be spaced apart from each other along the second direction DR2 in which the respective electrodes RME1 and RME2 extend, and may be aligned to be substantially parallel to each other. The light emitting elements ED may have a shape extending in a direction, and a direction in which the respective electrodes RME1 and RME2 extend and a direction in which the light emitting elements ED extend may be substantially perpendicular to each other. However, embodiments are not limited thereto, and the light emitting elements ED may also be oblique to the direction in which the respective electrodes RME1 and RME2 extend.

The light emitting element ED may include semiconductor layers doped with different conductivity types. The light emitting element ED may include semiconductor layers, and may be oriented (or arranged) so that end portion thereof faces a specific direction according to a direction of an electric field generated on the electrodes RME1 and RME2 For example, the light emitting element ED may include a light emitting layer 36 (see FIG. 6) to emit light of a specific wavelength band. The light emitting element ED may emit light of different wavelength bands according to a material of the light emitting layer 36. However, since the display device 10 includes the color control members TPL, WCL1, and WCL2 and the color filter layer CFL, even though the light emitting elements ED disposed in each sub-pixel PXn emit light of the same color, the display device 10 may display a different color for each sub-pixel PXn.

In an embodiment, the display device 10 may include light emitting elements ED emitting light of a first color, but light of different colors may be displayed in light transmitting areas TA1, TA2, and TA3 corresponding to the respective sub-pixels PXn. For example, each of first light emitting elements ED1 disposed in the first sub-pixel PX1, second light emitting elements ED2 disposed in the second sub-pixel PX2, and third light emitting elements ED3 disposed in the third sub-pixel PX3 may emit the light of the first color, but light passing through the color control members TPL, WCL1, and WCL2 in the first sub-pixel PX1, the second sub-pixel PX2, and the third sub-pixel PX3 may be emitted as the light of the first color, light of a second color, and light of a third color, respectively.

The light emitting elements ED may be disposed on the respective electrodes RME1 and RME2 between the first banks BNL1. For example, the light emitting elements ED may be disposed so that end portions thereof may be put on the first electrode RME1 and the other end portions thereof may be put on the second electrode RME2. An extension length of the light emitting elements ED may be greater than the distance between the first electrode RME1 and the second electrode RME2, and end portions (e.g., opposite end portions) of the light emitting elements ED may be disposed on the first electrode RME1 and the second electrode RME2, respectively.

The light emitting element ED may include layers disposed in a direction parallel to the upper surface of the first substrate SUB1. The light emitting element ED of the display device 10 may be disposed so that a direction in which the light emitting element ED extends is parallel to the first substrate SUB1, and the semiconductor layers included in the light emitting element ED may be sequentially disposed along the direction parallel to the upper surface of the first substrate SUB1. However, embodiments are not limited thereto. In some cases, in case that the light emitting element ED has another structure, the layers may also be disposed in a direction perpendicular to the first substrate SUB1.

End portions (e.g., opposite end portions) of the light emitting elements ED may be in contact with the contact electrodes CNE1 and CNE2, respectively. An insulating film 38 (see FIG. 6) may not be formed on end surfaces of the light emitting element ED in a direction in which the light emitting element ED extends and some of the semiconductor layers are exposed. Thus, the exposed semiconductor layers may be in contact with the contact electrodes CNE1 and CNE2, respectively. However, embodiments are not limited thereto. In some cases, at least partial areas of the insulating film 38 of the light emitting element ED may be removed and the insulating film 38 may be removed, such that side surfaces of end portions (e.g., opposite end portions) of the semiconductor layers may be partially exposed. The exposed side surfaces of the semiconductor layers may also be in contact with (e.g., in direct contact with) the contact electrodes CNE1 and CNE2.

A second insulating layer PAS2 may be partially disposed on the light emitting elements ED. As an example, the second insulating layer PAS2 may partially surround outer surfaces of the light emitting elements ED, and may be disposed so as not to cover end portions and the other end portions of the light emitting elements ED. Contact electrodes CNE1 and CNE2 to be described below may be in contact with end portions (e.g., opposite end portions) of the light emitting elements ED that are not covered by the second insulating layer PAS2, respectively. Portions of the second insulating layer PAS2 disposed on the light emitting elements ED may extend in the second direction DR2 on the first insulating layer PAS1 in plan view to form a linear pattern or an island-shaped pattern within each sub-pixel PXn. The second insulating layer PAS2 may fix the light emitting elements ED in the processes of manufacturing the display device 10, and may protect the light emitting elements ED.

Contact electrodes CNE1 and CNE2 and a third insulating layer PAS3 may be disposed on the second insulating layer PAS2.

The contact electrodes CNE1 and CNE2 may have a shape extending in a direction. The contact electrodes CNE1 and CNE2 may include a first contact electrode CNE1 and a second contact electrode CNE2. The first contact electrode CNE1 may be disposed on the first electrode RME1, the second contact electrode CNE2 may be disposed on the second electrode RME2, and each of the first contact electrode CNE1 and the second contact electrode CNE2 may have a shape extending in the second direction DR2. The first contact electrode CNE1 and the second contact electrode CNE2 may be spaced apart from and face each other in the first direction DR1, and may form a linear pattern in the light emitting area EMA of each sub-pixel PXn.

In some embodiments, widths of the first contact electrode CNE1 and the second contact electrode CNE2 measured in a direction may be smaller than widths of the first electrode RME1 and the second electrode RME2 measured in the direction, respectively. The first contact electrode CNE1 and the second contact electrode CNE2 may cover portions of the upper surfaces of the first electrode RME1 and the second electrode RME2 with being in contact with end portions and the other end portions of the light emitting elements ED, respectively.

The contact electrodes CNE1 and CNE2 may be in contact with the light emitting elements ED and the electrodes RME1 and RME2, respectively. The light emitting elements ED may have semiconductor layers exposed on end surfaces (e.g., opposite end surfaces) thereof in the direction in which they extend, and the first contact electrode CNE1 and the second contact electrode CNE2 may be in contact with the light emitting elements ED on the end surfaces on which the semiconductor layers are exposed. End portions of the light emitting elements ED may be connected (e.g., electrically connected) to the first electrode RME1 through the first contact electrode CNE1, and the other end portions of the light emitting elements ED may be connected (e.g., electrically connected) to the second electrode RME2 through the second contact electrode CNE2.

It is illustrated in the drawing that a first contact electrode CNE1 and a second contact electrode CNE2 are disposed in a sub-pixel PXn, but embodiments are not limited thereto. The numbers of first contact electrode CNE1 and second contact electrode CNE2 may change according to the numbers of first electrodes RME1 and second electrodes RME2 disposed in each sub-pixel PXn.

The third insulating layer PAS3 may be disposed on the first contact electrode CNE1. The third insulating layer PAS3 may electrically insulate the first contact electrode CNE1 and the second contact electrode CNE2 from each other. The third insulating layer PAS3 may cover the first contact electrode CNE1, but may not be disposed on the other end portions of the light emitting elements ED so that the light emitting elements ED may be in contact with the second contact electrode CNE2. The third insulating layer PAS3 may be in contact with the first contact electrode CNE1 and the second insulating layer PAS2 on an upper surface of the second insulating layer PAS2. A side surface of the third insulating layer PAS3 in a direction in which the second electrode RME2 is disposed may be aligned with a side surface of the second insulating layer PAS2 For example, the third insulating layer PAS3 may be disposed on the non-light emitting area, for example, on the first insulating layer PAS1 disposed on the third interlayer insulating layer IL3. However, embodiments are not limited thereto.

The second contact electrode CNE2 may be disposed on the second electrode RME2, the second insulating layer PAS2, and the third insulating layer PAS3. The second contact electrode CNE2 may be in contact with the other end portions of the light emitting elements ED and an exposed upper surface of the second electrode RME2. The other end portions of the light emitting elements ED may be connected (e.g., electrically connected) to the second electrode RME2 through the second contact electrode CNE2.

The second contact electrode CNE2 may be in contact with the second insulating layer PAS2, the third insulating layer PAS3, the second electrode RME2, and the light emitting elements ED. The first contact electrode CNE1 and the second contact electrode CNE2 may not be in contact with each other by the second insulating layer PAS2 and the third insulating layer PAS3. However, embodiments are not limited thereto, and in some cases, the third insulating layer PAS3 may be omitted.

The contact electrodes CNE1 and CNE2 may include a conductive material. For example, the contact electrodes CNE1 and CNE2 may include ITO, IZO, ITZO, aluminum (Al), or the like. As an example, the contact electrodes CNE1 and CNE2 may include a transparent conductive material, and the light emitted from the light emitting elements ED may be transmitted through the contact electrodes CNE1 and CNE2 and may transmit toward the electrodes RME1 and RME2. However, embodiments are not limited thereto.

For example, an insulating layer may be additionally formed to cover the contact electrodes CNE1 and CNE2, the third insulating layer PAS3, and the second bank BNL2. Such an insulating layer may be disposed (e.g., entirely disposed) on the first substrate SUB1 and may function to protect members disposed on the first substrate SUB1 from an external environment.

Each of the first insulating layer PAS1, the second insulating layer PAS2, and the third insulating layer PAS3 described above may include an inorganic insulating material or an organic insulating material. In an embodiment, the first insulating layer PAS1, the second insulating layer PAS2, and the third insulating layer PAS3 may include an inorganic insulating material such as silicon oxide ($SiO_x$), silicon nitride ($SiN_x$), silicon oxynitride ($SiO_xN_y$), aluminum oxide ($Al_xO_y$), or aluminum nitride ($Al_xN_y$). In another example, the first insulating layer PAS1, the second insulating layer PAS2, and the third insulating layer PAS3 may include an organic insulating material such as an acrylic resin, an epoxy resin, a phenolic resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin. However, embodiments are not limited thereto.

The color control members TPL, WCL1, and WCL2 may be disposed on the light emitting elements ED. According to an embodiment, the color control members TPL, WCL1, and WCL2 may be disposed in areas surrounded by the second bank BNL2. The color control members TPL, WCL1, and WCL2 may be disposed in each sub-pixel PXn, and may be disposed in the light emitting areas EMA among the areas surrounded by the second bank BNL2 but may not be disposed in the sub-areas CBA The sub-areas CBA may be areas in which the light emitting elements ED are not disposed, and light may not be substantially emitted in the sub-areas CBA. The color control members TPL, WCL1, and WCL2 may be disposed in the areas surrounded by the second bank BNL2 in areas in which the light emitting elements ED are disposed.

In some embodiments, a height of the color control members TPL, WCL1, and WCL2 may be greater than a height of the second bank BNL2 The color control members TPL, WCL1, and WCL2 may be formed by an inkjet printing process or a photoresist process among the processes of manufacturing the display device 10. The color control members TPL, WCL1, and WCL2 may be formed by jetting or applying materials of the color control members TPL, WCL1, and WCL2 into the areas surrounded by the second bank BNL2 and performing drying or exposing and developing processes. As an example, the materials of the color control members TPL, WCL1, and WCL2 may include an organic material to have viscosity, and even though the organic material is jetted or applied up to a position higher than the second bank BNL2, the organic material may not overflow into other sub-pixels PXn beyond the second bank BNL2. Accordingly, the height of the color control members TPL, WCL1, and WCL2 may be greater than that of the second bank BNL2. However, embodiments are not limited thereto.

In an embodiment in which the light emitting elements of each sub-pixel PXn emit the light of the first color, the color control members TPL, WCL1, and WCL2 may include a light transmitting layer TPL disposed in the first sub-pixel PX1, a first wavelength conversion layer WCL1 disposed in the second sub-pixel PX2, and a second wavelength conversion layer WCL2 disposed in the third sub-pixel PX3.

The light transmitting layer TPL may include a first base resin BRS1 and scatterers SCP disposed in the first base resin BRS1. The light transmitting layer TPL may transmit the light of the first color incident from the light emitting elements ED therethrough with maintaining a wavelength of the light of the first color. The scatterers SCP of the light transmitting layer TPL may function to adjust an emission path of the light emitted through the light transmitting layer TPL. The light transmitting layer TPL may not include wavelength conversion materials.

The first wavelength conversion layer WCL1 may include a second base resin BRS2 and first wavelength conversion materials WCP1 disposed in the second base resin BRS2. The second wavelength conversion layer WCL2 may include a third base resin BRS3 and second wavelength conversion materials WCP2 disposed in the third base resin BRS3. The first wavelength conversion layer WCL1 and the second wavelength conversion layer WCL2 may convert a wavelength of the light of the first color incident from the light emitting elements ED and may transmit the light having the converted wavelength therethrough. Scatterers SCP of the first wavelength conversion layer WCL1 and the second wavelength conversion layer WCL2 may increase wavelength conversion efficiency.

The scatterers SCP may be metal oxide particles or organic particles. Examples of metal oxide of the metal oxide particles may include titanium oxide ($TiO_2$), zirconium oxide ($ZrO_2$), aluminum oxide ($Al_xO_y$), indium oxide ($In_2O_3$), zinc oxide (ZnO), tin oxide ($SnO_2$), or the like, and examples of a material of the organic particles may include an acrylic resin, a urethane resin, or the like.

The first, second, and third base resins BRS1, BRS2, and BRS3 may include a light transmitting organic material. For example, the first, second, and third base resins BRS1, BRS2, and BRS3 may include an epoxy-based resin, an acrylic resin, a cardo-based resin, an imide-based resin, or the like. All of the first, second, and third base resins BRS1, BRS2, and BRS3 may be made of the same material, but embodiments are not limited thereto.

The first wavelength conversion material WCP1 may be a material that converts the light of the first color into light of a second color, and the second wavelength conversion material WCP2 may be a material that converts the light of the first color into light of a third color. The first wavelength conversion material WCP1 and the second wavelength conversion material WCP2 may be quantum dots, quantum rods, phosphors, or the like. The quantum dot may include group IV nanocrystals, group II-VI compound nanocrystals, group III-V compound nanocrystals, group IV-VI nanocrystals, or combinations thereof.

The color control members TPL, WCL1, and WCL2 may be disposed in the areas in which the light emitting elements ED are disposed, and may be surrounded by the second bank BNL2. In the display device 10, the second bank BNL2 may have a certain height and may surround the sub-pixels PXn. Thus, the base resins BRS1, BRS2, and BRS3 of the color control members TPL, WCL1, and WCL2 may be disposed (e.g., directly disposed) on the light emitting elements ED and the contact electrodes CNE1 and CNE2 connected to the light emitting elements ED.

According to an embodiment, the light transmitting layer TPL, the first wavelength conversion layer WCL1, and the second wavelength conversion layer WCL2 of the color control members TPL, WCL1, and WCL2 may correspond to the light emitting areas EMA surrounded by the second bank BNL2. Widths of the light transmitting layer TPL, the first wavelength conversion layer WCL1, and the second wavelength conversion layer WCL2 measured in the first direction DR1 may be smaller than a width of each color filter layer CFL measured in the first direction DR1. The color filter layers CFL may be disposed in areas surrounded by the second light blocking member BM2, and the second light blocking member BM2 may have a smaller width than the second bank BNL2, such that the color filter layers CFL may partially overlap the second bank BNL2 in the third direction DR3 (e.g., the thickness direction). For example, the color control members TPL, WCL1, and WCL2 may have substantially the same width as the light emitting areas EMA surrounded by the second bank BNL2, and may thus have a smaller width than the color filter layers CFL.

For example, the base resins BRS1, BRS2, and BRS3 may surround the light emitting elements ED, the first banks BNL1, the electrodes RME1 and RME2, the contact electrodes CNE1 and CNE2, and the like, disposed on the third interlayer insulating layer IL3 within the areas surrounded by the second bank BNL2. For example, the scatterers SCP and the wavelength conversion materials WCP1 and WCP2 of the color control members TPL, WCL1, and WCL2 may be disposed in the respective base resins BRS1. BRS2, and BRS3, and may be positioned in the vicinity of the light emitting elements ED.

Light emitted from the respective light emitting elements ED may be the light of the same first color. Light emitted from end portions (e.g., opposite end portions) of the light emitting elements ED may be reflected from the electrodes RME1 and RME2 disposed on the first banks BNL1 and may transmit toward the color control members TPL, WCL1, and WCL2 disposed on the light emitting elements ED. Light emitted from the first light emitting elements ED1 disposed in the first sub-pixel PX1 may be incident on the light transmitting layer TPL. Light emitted from the second light emitting elements ED2 disposed in the second sub-pixel PX2 may be incident on the first wavelength conversion layer WCL1. Light emitted from the third light emitting elements ED3 disposed in the third sub-pixel PX3 may be incident on the second wavelength conversion layer WCL2. The light incident on the light transmitting layer TPL may be transmitted as the light of the same first color without wavelength conversion, the light of the first color incident on the first wavelength conversion layer WCL1 may be converted into the light of the second color, and the light of the first color incident on the second wavelength conversion layer WCL2 may be converted into the light of the third color Even though the respective sub-pixels PXn include the light emitting elements ED emitting the light of the same color, the respective sub-pixels PXn may display light of different colors according to an arrangement of the color control members TPL, WCL1, and WCL2 disposed on the light emitting elements ED.

Even though the display device 10 according to an embodiment includes only the light emitting elements ED emitting the light of the first color, the display device 10 may convert the light of the first color into light of other colors through the color control members TPL, WCL1, and WCL2 and emit the light of other colors. The color control members TPL, WCL1, and WCL2 may be disposed (e.g., directly disposed) on the light emitting elements ED in the first display substrate 100 of the display device 10, and most of the light emitted from the light emitting elements ED may be incident (e.g., directly incident) on the color control members TPL, WCL1, and WCL2 without being reflected or absorbed by other members. For example, the first wavelength conversion layer WCL1 and the second wavelength conversion layer WCL2, which convert the light emitted from the light emitting elements ED into the light of other colors, may be disposed (e.g., directly disposed) at least on the light emitting elements ED. Thus, light conversion efficiency and a color matching rate may be improved.

It is illustrated in the drawing that all of the color control members TPL, WCL1, and WCL2 are disposed on the first display substrate 100, but embodiments are not limited thereto. In some embodiments, some of the color control members TPL, WCL1, and WCL2 may also be disposed on the second display substrate 300. This will be described with reference to other embodiments.

A first capping layer CPL1 may be disposed on the color control members TPL, WCL1, and WCL2. The first capping layer CPL1 may cover the color control members TPL, WCL1, and WCL2 and the second bank BNL2. The first capping layer CPL1 may prevent a phenomenon in which impurities such as moisture or air permeate from the outside to damage or contaminate the color control members TPL, WCL1, and WCL2. For example, the first capping layer CPL1 may prevent the materials of the color control members TPL, WCL1, and WCL2 from being diffused (or permeated) into other components. The first capping layer CPL1 may be made of an inorganic material. For example, the first capping layer CPL1 may include silicon nitride, aluminum nitride, zirconium nitride, titanium nitride, hafnium nitride, tantalum nitride, silicon oxide, aluminum oxide, titanium oxide, tin oxide, silicon oxynitride, and the like. In another example, the first capping layer CPL1 may be omitted.

A first light blocking member BM1 may be disposed on the first capping layer CPL1. The first light blocking member BM1 may be made of a material capable of blocking light transmission to prevent the occurrence of color mixing due to permeation of the light emitted from the color control members TPL, WCL1, and WCL2 into adjacent sub-pixels PXn. The first light blocking member BM1 may be disposed along the boundary area between the sub-pixels PXn. For example, the first light blocking member BM1 may be disposed along spaces between the color control members TPL, WCL1, and WCL2 spaced apart from each other, and may overlap the non-light emitting areas NEA or the second bank BNL2 in the thickness direction. The first light blocking member BM1 may fill valley portions disposed in the spaces between the color control members TPL, WCL1, and WCL2 spaced apart from each other. An upper surface of the first light blocking member BM1 may be recessed as compared with upper surfaces of the color control members TPL, WCL1, and WCL2 in the thickness direction, but embodiments are not limited thereto. In another example, an upper surface of the first light blocking member BM1 may also be higher than upper surfaces of the color control members TPL, WCL1, and WCL2, or may also be flat or protrude upward.

The first light blocking member BM1 may include an organic material. The first light blocking member BM1 may include a light absorbing material absorbing light of a visible light wavelength band. In an embodiment, the first light blocking member BM1 may include an organic light blocking material.

The second light blocking member BM2 and the color filter layers CFL1, CFL2 and CFL3 of the second display substrate 300 may be disposed on the color control members TPL, WCL1, and WCL2 and the first light blocking member BM1. A base layer SML may be disposed on the color control members TPL, WCL1, and WCL2 and the first light blocking member BM1, and the first display substrate 100 may be bonded to the second display substrate 300 through the base layer SML.

The base layer SML may function to couple the first display substrate 100 and the second display substrate 300 to each other, and may fill a space between the first display substrate 100 and the second display substrate 300. The base layer SML may be disposed on the first capping layer CPL1 and the first light blocking member BM1 of the first display substrate 100, and may planarize a step formed by the first capping layer CPL1 and the first light blocking member BM1. For example, the base layer SML may be made of a material capable of transmitting light, and accordingly, the light emitted from the first display substrate 100 may be emitted through the second display substrate 300. As an example, the base layer SML may be made of a Si-based organic material, an epoxy-based organic material, or the like, but embodiments are not limited thereto. In some embodiments, the base layer SML may include a low refractive material and fill the space between the first display substrate 100 and the second display substrate 300.

The second display substrate 300 may include the second substrate SUB2 and the second light blocking member BM2 and the color filter layer CFL disposed on a surface of the second substrate SUB2 facing the first substrate SUB1 The second substrate SUB2 may be made of a transparent insulating material such as glass, quartz, or a polymer resin, similar to the first substrate SUB1. For example, the first substrate SUB1 may be a rigid substrate, but may also be a flexible substrate that is bendable, foldable, or rollable. The second substrate SUB2 may include light transmitting areas TA1, TA2 and TA3 and light blocking areas BA. The light transmitting areas TA1, TA2, and TA3 may correspond to the light emitting areas EMA of the first display substrate 100, and the light blocking areas BA may correspond to the non-light emitting areas NEA. The light transmitting areas TA1, TA2, and TA3 may correspond to the respective sub-pixels PXn and include a first light transmitting area TA1, a second light transmitting area TA2, and a third light transmitting area TA3. The light transmitting areas TA1, TA2, and TA3 may be areas in which the color filter layer CFL is disposed and the light emitted from the light emitting elements ED is transmitted, and the light blocking areas BA may be areas in which the second light blocking member BM2 is disposed, and accordingly, the light is not emitted.

The second light blocking member BM2 may be disposed on a surface of the second substrate SUB2, e.g., a surface of the second substrate SUB2 facing the first substrate SUB1. The second light blocking member BM2 may overlap the second bank BNL2 of the first display substrate 100 in the thickness direction (e.g., the third direction DR3), and may be disposed in the light blocking areas BA. The second light blocking member BM2 may be formed in a lattice shape in a plan view including openings exposing a surface of the second substrate SUB2. The second light blocking member BM2 may overlap portions of the second bank BNL2 in the boundary areas between the sub-pixels PXn. For example, the second light blocking member BM2 may not surround only areas corresponding to the light emitting areas EMA, and may be disposed at boundary areas between the sub-pixels PXn in which the color filter layers CFL1, CFL2, and CFL3 are disposed as well as in portions of the non-light emitting areas NEA.

The second light blocking member BM2 may include an organic material. The second light blocking member BM2 may reduce distortion of colors due to external light reflection by absorbing external light. In an embodiment, the second light blocking member BM2 may absorb all of visible light wavelengths. The second light blocking member BM2 may include a light absorbing material. For example, the first light blocking member BM1 and the second light blocking member BM2 may be made of substantially the same material.

In another example, the second light blocking member BM2 may absorb light of a specific wavelength of visible light wavelengths and transmit light of another specific wavelength therethrough. For example, the second light blocking member BM2 and a first color filter layer CFL1 may be made of the same material. In some embodiments, the second light blocking member BM2 may be integral with the first color filter layer.

The color filter layers CFL1, CFL2, and CFL3 may be disposed on the second substrate SUB2 exposed through the openings of the second light blocking member BM2. The color filter layers CFL1, CFL2, and CFL3 may include the first color filter layer CFL1 disposed in the first light transmitting area TA1 corresponding to the first sub-pixel PX1, a second color filter layer CFL2 disposed in the second light transmitting area TA2 corresponding to the second sub-pixel PX2, and a third color filter layer CFL3 disposed in the third light transmitting area TA3 corresponding to the third sub-pixel PX3. Each of the color filter layers CFL1, CFL2, and CFL3 may include a colorant such as a dye or a pigment absorbing light of a wavelength other than a color wavelength displayed by each sub-pixel PXn. The first color filter layer CFL1 may be a blue color filter layer, the second color filter layer CFL2 may be a green color filter, and the third color filter layer CFL3 may be a red color filter layer. The light emitted from the light emitting elements ED may pass through the color control members TPL, WCL1, and WCL2 and be emitted through the color filter layers CFL1, CFL2, and CFL3.

For example, the light of the first color emitted from the first light emitting elements ED1 of the first sub-pixel PX1 may pass through the light transmitting layer TPL and may be incident on the first color filter layer CFL1 in a state in which a color of the light is not changed. The first base resin BRS1 of the light transmitting layer TPL may be made of a transparent material, and some of the light may be transmitted through the first base resin BRS1 and may be incident on the first capping layer CPL1 and the first color filter layer CFL1 disposed on the first base resin BRS1. For example, at least some of the light may be incident on the scatterers SCP disposed in the first base resin BRS1 to be scattered, and may be incident on the first capping layer CPL1 and the first color filter layer CFL1. The first color filter layer CFL1 may block transmission of light of colors other than the light of the first color, and the light of the first color may be displayed in the first light transmitting area TAL.

The light of the first color emitted from the second light emitting elements ED2 of the second sub-pixel PX2 may pass through the first wavelength conversion layer WCL1, such that some of the light of the first color may be converted into the light of the second color and may be incident on the second color filter layer CFL2. The second base resin BRS2 of the first wavelength conversion layer WCL1 may be made of a transparent material, and some of the light may be transmitted through the second base resin BRS2. However, at least some of the light may be incident on the scatterers SCP and the first wavelength conversion materials WCP1 disposed in the second base resin BRS2, may be scattered and wavelength-converted, and may be incident on the first capping layer CPL1 and the second color filter layer CFL2 as the light of the second color The second color filter layer CFL2 may block transmission of light of colors other than the light of the second color, and the light of the second color may be displayed in the second light transmitting area TA2. In the third light transmitting area TA3, the light of the first color emitted from the third light emitting elements ED3 may pass through the second wavelength conversion layer WCL2 and the third color filter layer CFL3 to be displayed as the light of the third color. The display device 10 may display light of a different color for each sub-pixel PXn even though the respective light emitting elements ED include the light emitting elements ED emitting the light of the same color.

It is illustrated in the drawing that neighboring color filter layers CFL1, CFL2, and CFL3 are disposed to be spaced apart from each other based on the second light blocking member BM2, but the neighboring color filter layers CFL1, CFL2, and CFL3 may also at least partially overlap each other on the second light blocking member BM2.

The color filter layers CFL1, CFL2, and CFL3 may cover the light emitting areas EMA in the respective sub-pixels PXn. It is illustrated in the drawing that the color filter layers CFL1, CFL2, and CFL3 are disposed in each sub-pixel PXn to form an island-shaped pattern, but embodiments are not limited thereto. The color filter layers CFL1, CFL2, and CFL3 may also form a linear pattern over the entirety of the display area DPA. For example, the second light blocking member BM2 may have a smaller width than the second bank BNL2, and the color filter layers CFL1, CFL2, and CFL3 may partially overlap the second bank BNL2 in the thickness direction.

A second capping layer CPL2 may be disposed on the color filter layers CFL1, CFL2, and CFL3 and the second light blocking member BM2 The second capping layer CPL2 may prevent impurities such as moisture or air from permeating from the outside to damage or contaminate the color filter layers CFL1, CFL2, and CFL3 The second capping layer CPL2 and the first capping layer CPL1 may include the same material, but embodiments are not limited thereto.

In the display device 10 according to an embodiment, by disposing the color control members TPL, WCL1, and WCL2 in the first display substrate 100 together with the light emitting elements ED, the light conversion efficiency using the light emitted from the light emitting elements ED may be improved, and the color matching rate may be improved. Further, by disposing the color filter layer CFL in the second display substrate 300, which is separated from the first display substrate 100, the color control members TPL, WCL1, and WCL2 may be protected from being damaged in a thermal process required in case that the color filter layer CFL is formed. The display device 10 may include the color control members TPL, WCL1, and WCL2 and the color filter layer CFL with using the light emitting elements ED including the semiconductor layers. Thus, a display device may be implemented to have improved light efficiency and color matching rate.

Figure 6:
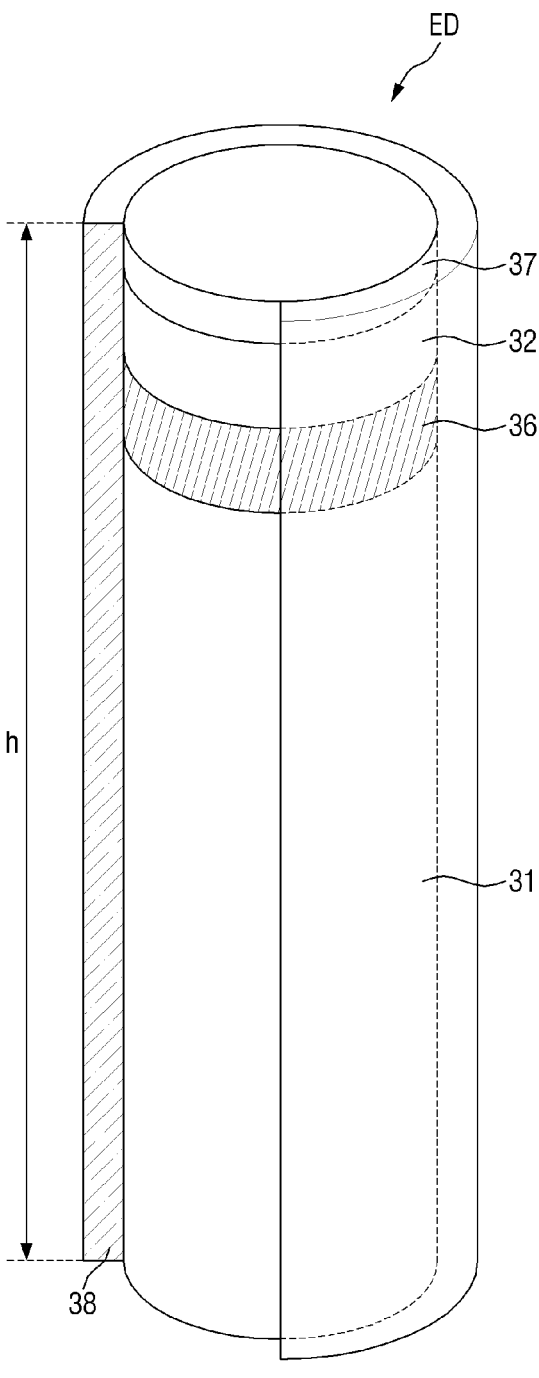
FIG. 6 is a schematic view of a light emitting element according to an embodiment.

FIG. 6 is a schematic view of a light emitting element according to an embodiment.

The light emitting element ED may be a light emitting diode. For example, the light emitting element ED may be an inorganic light emitting diode having a size of a micrometer or nanometer unit and made of an inorganic material or an inorganic semiconductor The inorganic light emitting diodes may be aligned between two electrodes in which polarities are formed in case that an electric field is formed in a specific direction between the two electrodes facing each other. The light emitting elements ED may be aligned between the two electrodes by the electric field formed on the two electrodes.

The light emitting element ED according to an embodiment may have a shape extending in a direction. The light emitting element ED may have a shape such as a rod shape, a wire shape, or a tube shape. In an embodiment, the light emitting element ED may have a cylindrical shape or a rod shape. However, the light emitting element ED is not limited to the shape described above, and may have various shapes. For example, the light emitting element ED may have a polygonal prismatic shape such as a cubic shape, a rectangular parallelepiped shape, or a hexagonal prismatic shape or may have a shape extending in a direction and including partially inclined outer surfaces. Semiconductors included in a light emitting element ED to be described below may have a structure in which they are sequentially disposed or stacked along the direction.

The light emitting element ED may include a semiconductor layer doped with any conductivity-type (e.g., p-type or n-type) impurities. The semiconductor layer may receive an electrical signal applied from an external power source to emit light of a specific wavelength band.

Referring to FIG. 6, the light emitting element ED may include a first semiconductor layer 31, a second semiconductor layer 32, a light emitting layer 36, an electrode layer 37, and an insulating film 38.

The first semiconductor layer 31 may be an n-type semiconductor. In case that the light emitting element ED emits light of a blue wavelength band, the first semiconductor layer 31 may include a semiconductor material having a chemical formula: $Al_xGa_yIn_{1-x-y}N$ ($0 \leq x \leq 1$, $0 \leq y \leq 1$, and $0 \leq x+y \leq 1$). For example, the semiconductor material may be one or more of AlGaInN, GaN, AlGaN, InGaN, AlN, and InN doped with an n-type dopant. The first semiconductor layer 31 may be doped with an n-type dopant, which may be Si, Ge, Sn, or the like. In an embodiment, the first semiconductor layer 31 may be made of n-GaN doped with n-type Si. A length of the first semiconductor layer 31 may be in the range of about 1.5 μm to about 5 μm, but embodiments are not limited thereto.

The second semiconductor layer 32 may be disposed on a light emitting layer 36 to be described below. The second semiconductor layer 32 may be a p-type semiconductor, and as an example, in case that the light emitting element ED emits light of a blue or green wavelength band, the second semiconductor layer 32 may include a semiconductor material having a chemical formula: $Al_xGa_yIn_{1-x-y}N$ ($0 \leq x \leq 1$, $0 \leq y \leq 1$, and $0 \leq x+y \leq 1$). For example, the semiconductor material may be one or more of AlGaInN, GaN, AlGaN, InGaN, AlN, and InN doped with a p-type dopant. The second semiconductor layer 32 may be doped with a p-type dopant, which may be Mg, Zn, Ca, Ba, or the like. In an embodiment, the second semiconductor layer 32 may be made of p-GaN doped with p-type Mg. A length of the second semiconductor layer 32 may be in the range of about 0.05 μm to about 0.10 μm, but embodiments are not limited thereto.

It is illustrated in the drawing that each of the first semiconductor layer 31 and the second semiconductor layer 32 is formed as a single layer, but embodiments are not limited thereto. According to some embodiments, each of the first semiconductor layer 31 and the second semiconductor layer 32 may further include a larger number of layers, for example, a clad layer or a tensile strain barrier reducing (TSBR) layer, according to a material of the light emitting layer 36.

The light emitting layer 36 may be disposed between the first semiconductor layer 31 and the second semiconductor layer 32. The light emitting layer 36 may include a material having a single quantum well structure or a multiple quantum well structure. In case that the light emitting layer 36 includes the material having the multiple quantum well structure, the light emitting layer 36 may have a structure in which quantum layers and well layers are alternately stacked. As an example, in case that the light emitting layer 36 emits light of a blue wavelength band, the light emitting layer 36 may include a material such as AlGaN or AlGaInN. For example, in case that the light emitting layer 36 has the multiple quantum well structure, e.g., the structure in which the quantum layers and the well layers are alternately stacked, the quantum layers may include a material such as AlGaN or AlGaInN, and the well layers may include a material such as GaN or AlInN. In an embodiment, the light emitting layer 36 may include AlGaInN as a material of the quantum layers and AlInN as a material of the well layers to emit blue light having a central wavelength band in the range of about 450 nm to about 495 nm, as described above.

However, embodiments are not limited thereto, and the light emitting layer 36 may have a structure in which semiconductor materials having great band gap energy and semiconductor materials having small band gap energy are alternately stacked, and may include other Group III to Group V semiconductor materials according to a wavelength band of emitted light. The light emitted by the light emitting layer 36 is not limited to the light of the blue wavelength band, and in some cases, the light emitting layer 36 may also emit light of red and green wavelength bands. A length of the light emitting layer 36 may be in the range of about 0.05 µm to about 0.10 µm, but embodiments are not limited thereto.

For example, the light emitted from the light emitting layer 36 may be emitted not only to outer surfaces of the light emitting element ED in a length direction, but also to side surfaces (e.g., opposite side surfaces) of the light emitting element ED. A direction of the light emitted from the light emitting layer 36 is not limited to a direction.

The electrode layer 37 may be an ohmic contact electrode. However, embodiments are not limited thereto, and the electrode layer 37 may also be a Schottky contact electrode. The light emitting element ED may include at least one electrode layer 37. It is illustrated in FIG. 6 that the light emitting element ED includes one electrode layer 37, but embodiments are not limited thereto. In some cases, the light emitting element ED may include a larger number of electrode layers 37 or the electrode layer 37 may be omitted. A description of a light emitting element ED to be provided below is equally applied even though the number of electrode layers 37 is changed or the light emitting element 30 further includes another structure.

The electrode layer 37 may decrease resistance between the light emitting element E) and the electrodes or the contact electrodes in case that the light emitting element ED is electrically connected to the electrodes or the contact electrodes in the display device 10 according to an embodiment. The electrode layer 37 may include a metal having conductivity. The electrode layer 37 may include at least one of aluminum (Al), titanium (Ti), indium (In), gold (Au), silver (Ag), indium tin oxide (ITO), indium zinc oxide (IZO), and indium tin zinc oxide (ITZO). The electrode layer 37 may include a semiconductor material doped with an n-type dopant or a p-type dopant. However, embodiments are not limited thereto.

The insulating film 38 may surround outer surfaces of the semiconductor layers and the electrode layers described above. In an embodiment, the insulating film 38 may surround at least an outer surface of the light emitting layer 36, and may extend in a direction in which the light emitting element ED extends. The insulating film 38 may function to protect these members. As an example, the insulating film 38 may surround side surface portions of these members, but may expose end portions (e.g., opposite end portions) of the light emitting element ED in the length direction.

It is illustrated in the drawing that the insulating film 38 is formed to extend in the length direction of the light emitting element ED to cover side surfaces of the first semiconductor layer 31 to the electrode layer 37, but embodiments are not limited thereto. The insulating film 38 may cover outer surfaces of the light emitting layer 36 and some of the semiconductor layers or cover a portion of a side surface of the electrode layer 37, such that the side surface of each electrode layer 37 may be partially exposed. For example, the insulating film 38 may also be formed so that an upper surface thereof may be rounded in cross section in an area adjacent to at least one end portion of the light emitting element ED A thickness of the insulating film 38 may be in the range of about 10 nm to about 1.0 µm, but embodiments are not limited thereto. The thickness of the insulating film 38 may be about 40 nm.

The insulating film 38 may include materials having insulating properties, such as silicon oxide ($SiO_x$), silicon nitride ($SiN_x$), silicon oxynitride ($SiO_xN_y$), aluminum nitride ($Al_xN_y$), and aluminum oxide ($AlO_x$). Accordingly, an electrical short circuit that occurs in case that the light emitting layer 36 is in direct contact with an electrode through which an electrical signal is transferred to the light emitting element ED may be prevented. The insulating film 38 may protect an outer surface of the light emitting element ED as well as the light emitting layer 36, and may thus prevent (or minimize) a decrease in luminous efficiency.

In some embodiments, an outer surface of the insulating film 38 may be surface-treated. The light emitting elements ED may be jetted onto and be aligned on electrodes in a state in which they are dispersed in ink. In order to maintain the light emitting elements ED in a state in which the light emitting elements ED are dispersed without being agglomerated with other adjacent light emitting elements ED in the ink, a hydrophobic or hydrophilic treatment may be performed on a surface of the insulating film 38.

The light emitting element ED may have a length h in a range of about 1 µm to about 10 µm, in a range of about 2 µm to about 6 µm, or in a range of about 3 µm to about 5 µm. For example, a diameter of the light emitting element ED may be in the range of about 30 nm to about 700 nm, and an aspect ratio of the light emitting element ED may be about 1.2 to about 100. However, embodiments are not limited thereto, and the light emitting elements ED included in the display device 10 may also have different diameters according to a difference in composition between the light emitting layers 36. For example, the diameter of the light emitting element ED may be about 500 nm.

Hereinafter, processes for manufacturing the display device 10 according to an embodiment will be described with further reference to other drawings.

FIGS. 7 to 17 are schematic cross-sectional views illustrating processes of manufacturing the display device according to an embodiment.

In processes of manufacturing the display device 10 to be described with reference to FIGS. 7 to 17, the order and a method of forming respective layers will be described in detail, and structures and arrangements of the respective layers are the same as those described above, and a detailed description thereof will thus be omitted for descriptive convenience.

Figure 7:
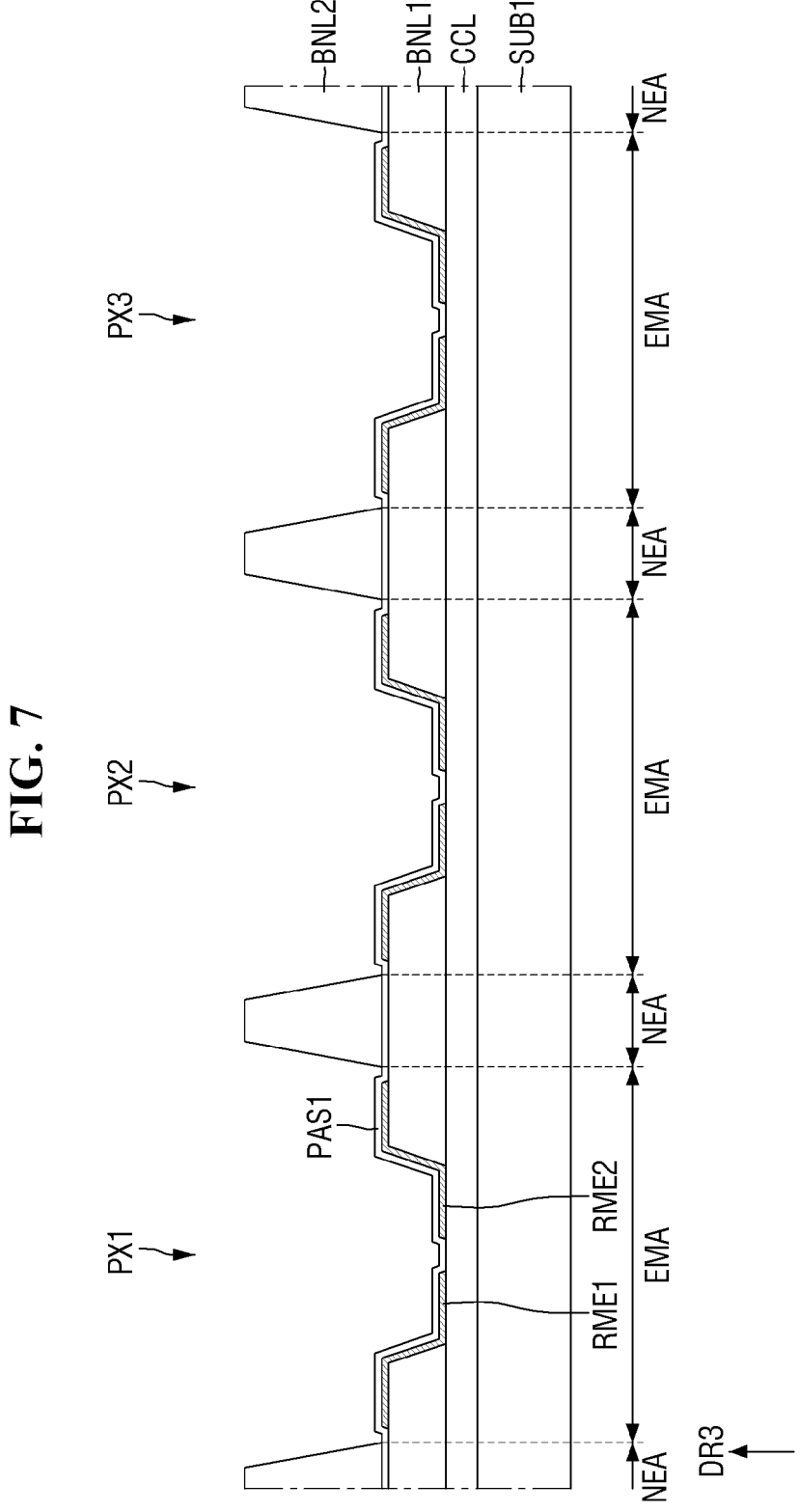

First, referring to FIG. 7, the first substrate SUB1 on which the circuit layer CCL is formed may be prepared, and the first bank BNL1, the electrodes RME1 and RME2, the first insulating layer PAS1 and the second bank BNl2 may be prepared. A description of arrangements and structures of the respective members is the same as described above. However, the first insulating layer PAS1 may cover the entirety of the upper surfaces of the electrodes RME1 and RME2, and may be formed in a state in which openings in which the contact electrodes CNE1 and CNE2 and the electrodes RME1 and RME2 are in contact with each other are not formed. The openings may be formed in the first insulating layer PAS1 after the light emitting elements ED are disposed in a subsequent process.

Figure 8:
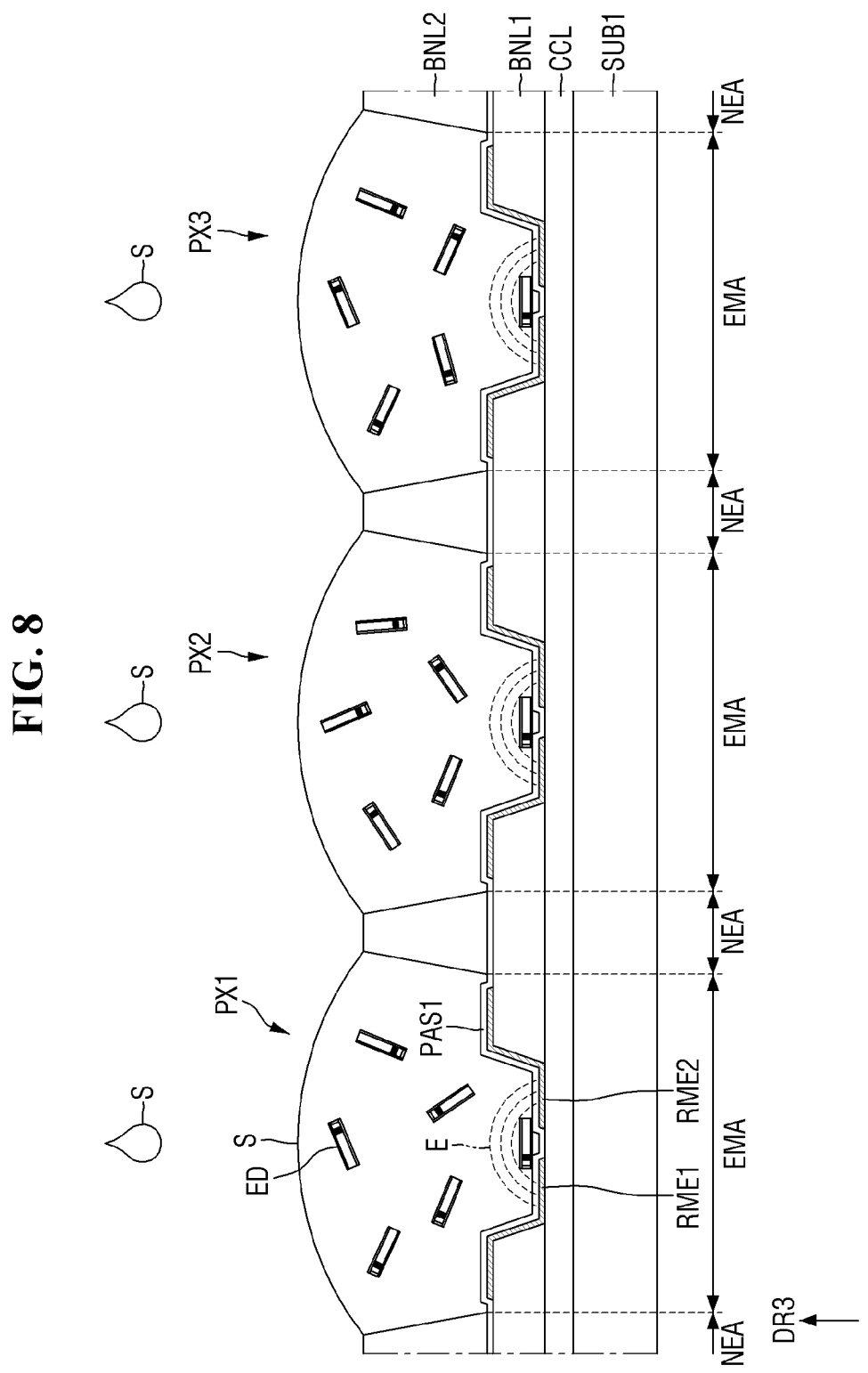
Figure 9:
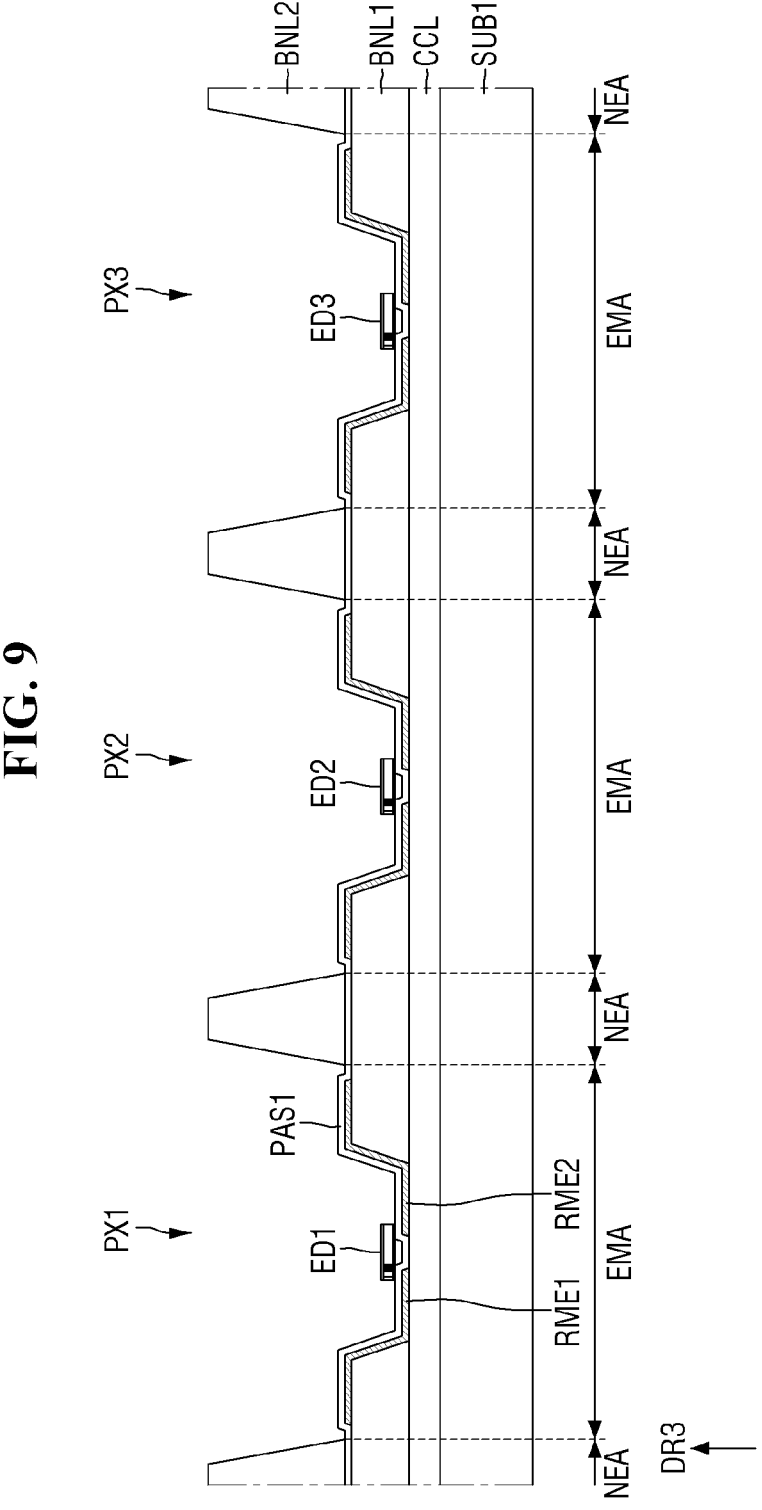

Referring to FIGS. 8 and 9, the light emitting elements ED may be disposed on the first insulating layer PAS1. End portions (e.g., opposite end portions) of the light emitting element ED may be disposed on the first electrode RME1 and the second electrode RME2, respectively, on the first insulating layer PAS1. In an embodiment, the light emitting elements ED may be prepared in a state in which they are dispersed in ink S, and may be jetted into each sub-pixel PXn by a printing process using an inkjet printing device. The ink S jetted through the inkjet printing device may be seated (or disposed) in areas surrounded by the second bank BNL2. For example, the second bank BNL2 may prevent the ink S from overflowing into other neighboring sub-pixels PXn.

In case that the ink S including the light emitting elements ED is jetted, an electric field E may be generated by applying alignment signals to the respective electrodes RME1 and RME2. The light emitting elements ED dispersed in the ink S may receive a dielectrophoretic force by the electric field E, and the light emitting elements ED receiving the dielectrophoretic force may be seated (or disposed) on the first insulating layer PAS1 in case that their orientation directions and positions are changed.

Figure 10:
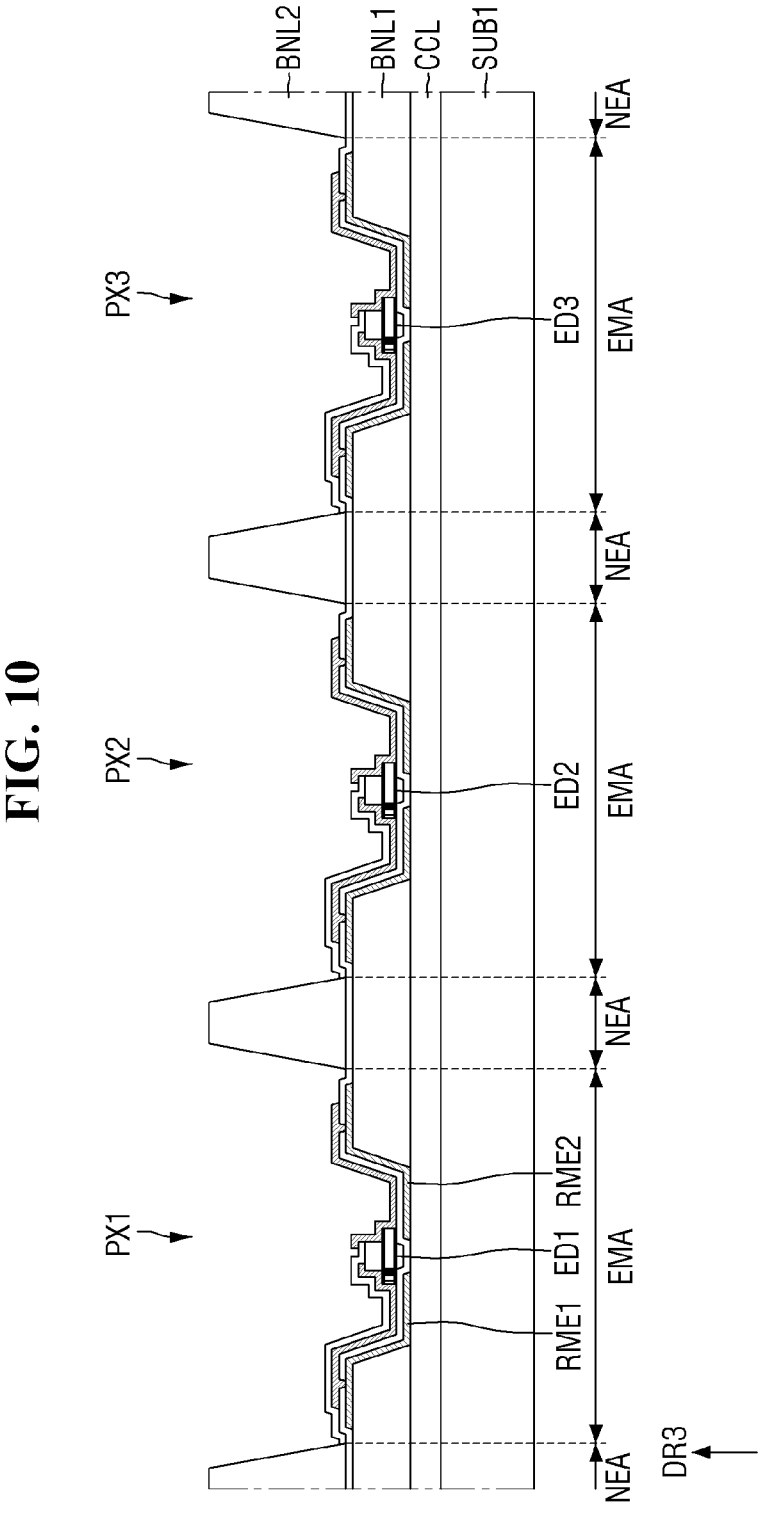

Referring to FIG. 10, after the light emitting elements ED are disposed on the first insulating layer PAS1, the second insulating layer PAS2, the contact electrodes CNE1 and CNE2, and the third insulating layer PAS3 may be formed.

Figure 11:
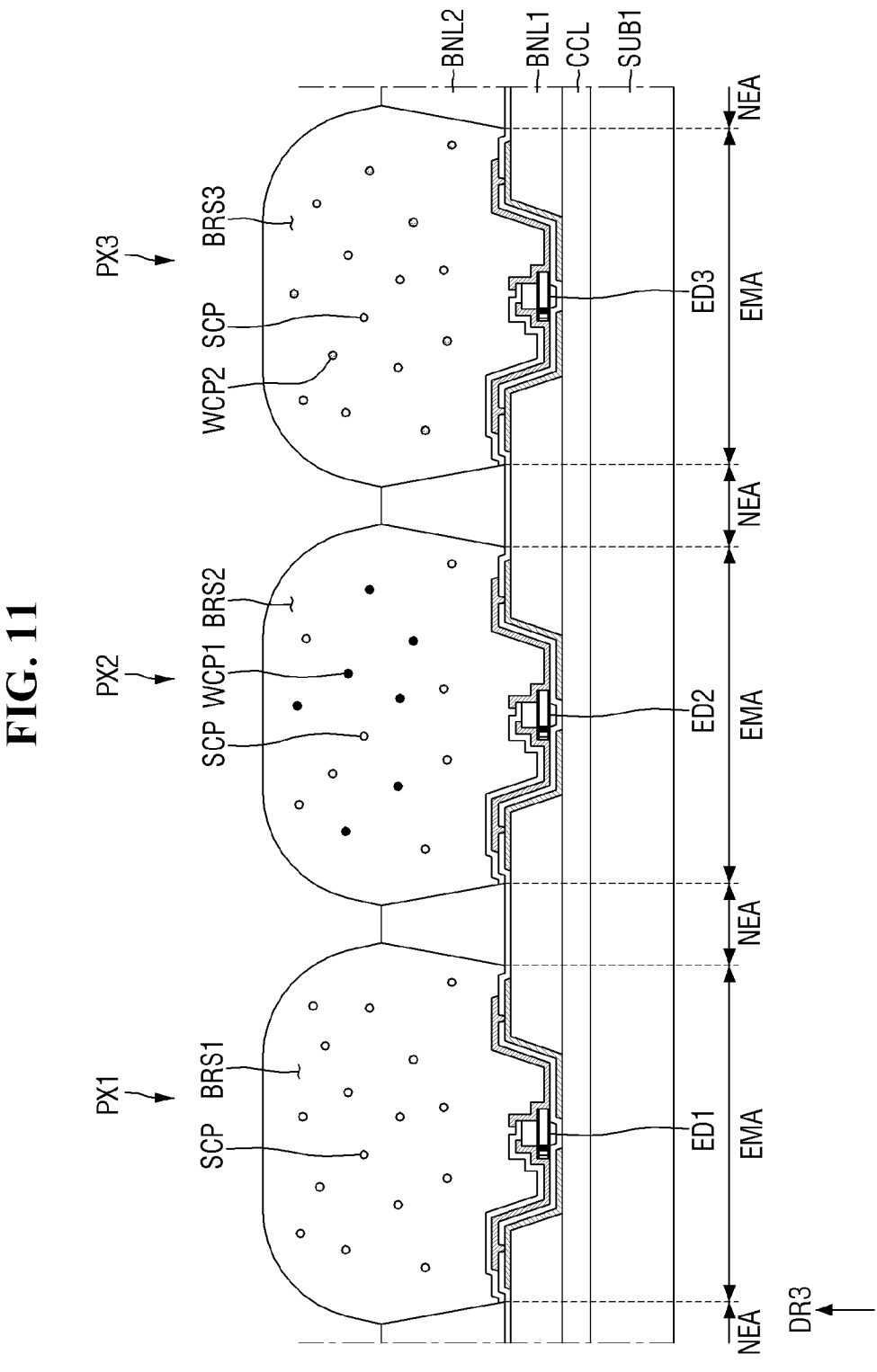
Figure 12:
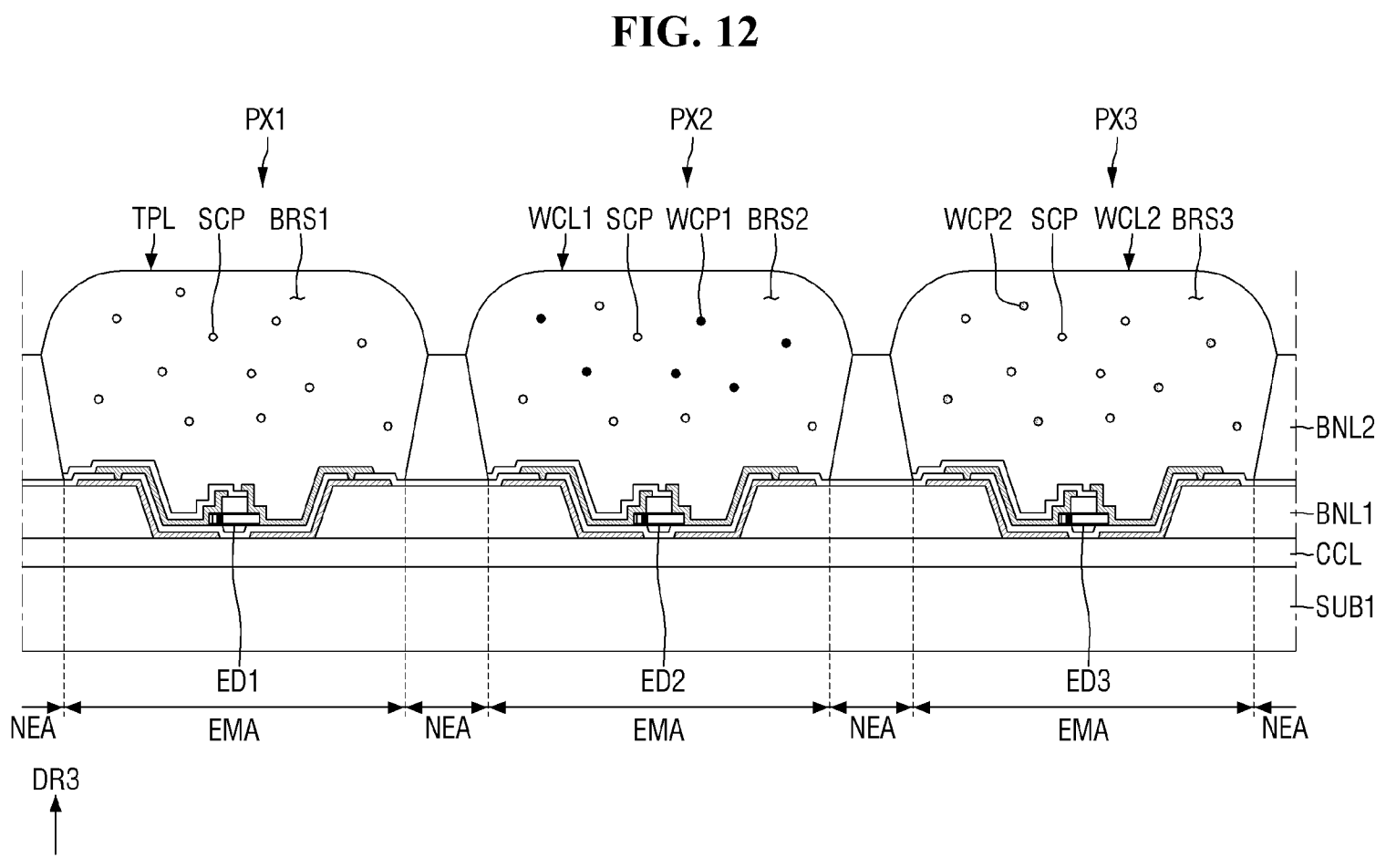

Referring to FIGS. 11 and 12, color control members TPL, WCL1, and WCL2 may be formed on the light emitting elements ED of each sub-pixel PXn. The light transmitting layer TPL may be formed on the first light emitting elements ED1 of the first sub-pixel PX1, the first wavelength conversion layer WCL1 may be formed on the second light emitting elements ED2 of the second sub-pixel PX2, and the second wavelength conversion layer WCL2 may be formed on the third light emitting elements ED3 of the third sub-pixel PX3.

A process of forming the color control members TPL, WCL1, and WCL2 is not limited. In an embodiment, the color control members TPL, WCL1, and WCL2 may be formed by an inkjet printing process or a photoresist process.

For example, in case that the color control members TPL, WCL1, and WCL2 are formed by the photoresist process, the color control members TPL, WCL1, and WCL2 may be formed by applying the base resins BRS1, BRS2, and BRS3 in which the scatterers SCP or the wavelength conversion materials WCP1 and WCP2 are dispersed into the areas surrounded by the second bank BNL2 and by exposing and developing the base resin BRS1, BRS2, and BRS3. For example, the base resins BRS1, BRS2, and BRS3 may be applied respectively to different areas of the areas surrounded by the second bank BNL2, and different color control members TPL, WCL1, and WCL2 may be formed for each sub-pixel PXn.

In another example, in case that the color control members TPL, WCL1, and WCL2 are formed by the inkjet printing process, the color control members TPL, WCL1, and WCL2 may be formed by jetting the base resins BRS1. BRS2, and BRS3 including the scatterers SCP or the wavelength conversion materials WCP1 and WCP2 into the areas surrounded by the second bank BNL2 and by drying the base resins BRS1, BRS2, and BRS3. For example, the second bank BNL2 may prevent the base resins BRS1, BRS2, and BRS3 from overflowing into other neighboring sub-pixels PXn, and different color control members TPL, WCL1, and WCL2 may be formed each sub-pixel PXn. For example, a separate bank for an inkjet process of the color control members TPL, WCL1, and WCL2 may be further formed. This will be described with reference to other embodiments.

Figure 13:
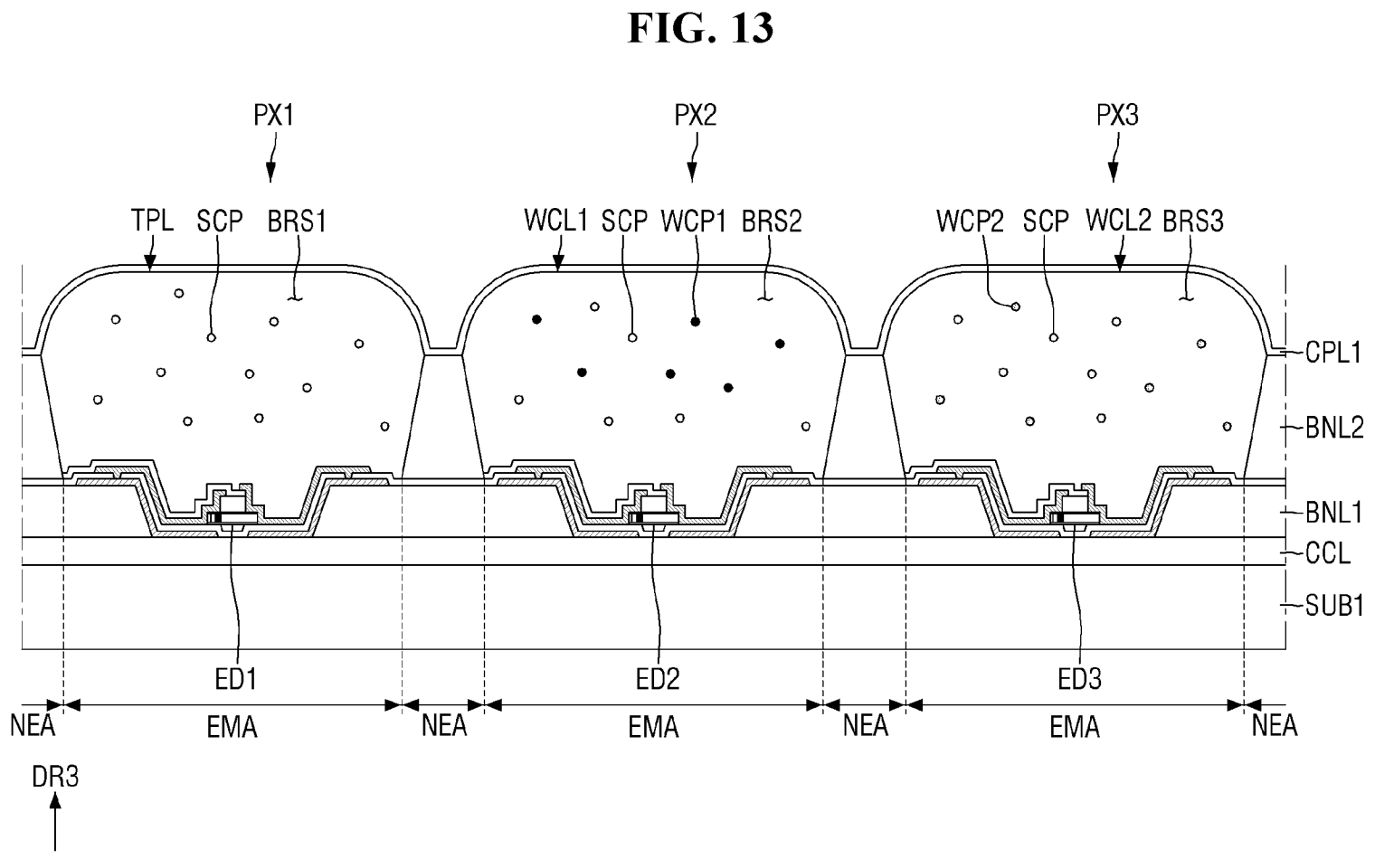

Referring to FIG. 13, the first capping layer CPL1 covering the color control members TPL, WCL1, and WCL2 and the second bank BNL2 may be formed on the color control members TPL, WCL1, and WCL2 and the second bank BNL2 The first capping layer CPL1 may be formed by a process of depositing a material of the first capping layer CPL1 on the first substrate SUB1 on which the color control members TPL, WCL1, and WCL2 are disposed. The first capping layer CPL1 may surround (or cover) the color control members TPL, WCL1, and WCL2, and may also be disposed on portions of an upper surface of the second bank BNL2 in which the color control members TPL, WCL1, and WCL2 are not disposed.

Figure 14:
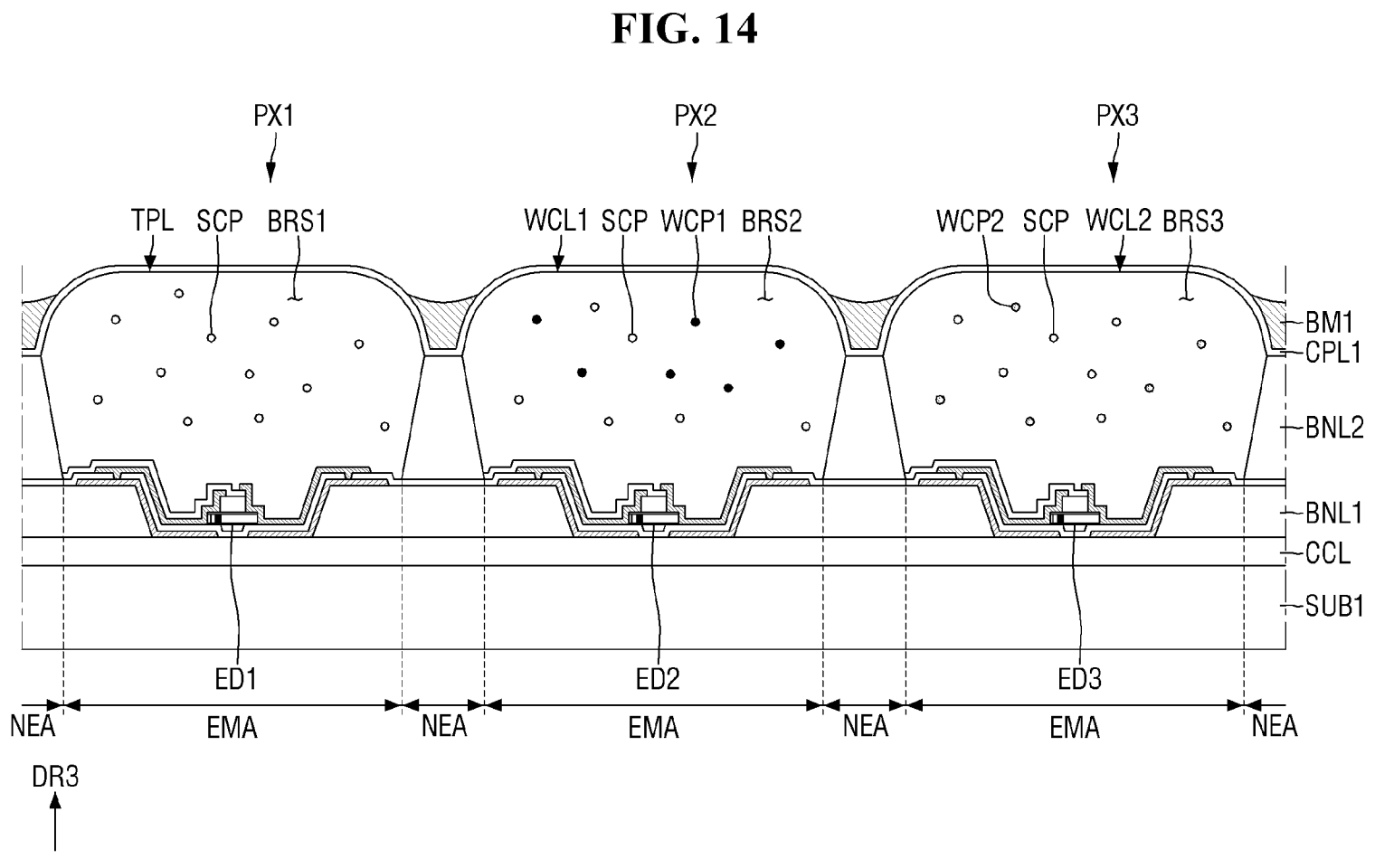

Referring to FIG. 14, the first light blocking member BM1 included in the first display substrate 100 may be formed on the first capping layer CPL1. The first light blocking member BM1 may be a portion disposed on the second bank BNL2 on the first capping layer CPL1, and may be formed in valley areas between the color control members TPL, WCL1, and WCL2. The first light blocking member BM1 may be formed by a process of applying a photosensitive organic material and exposing and developing the photosensitive organic material. In case that the first display substrate 100 is manufactured through the above processes, the second substrate SUB2 may be prepared and the second display substrate 300 on which the color filter layers CFL are disposed is manufactured.

Figure 15:
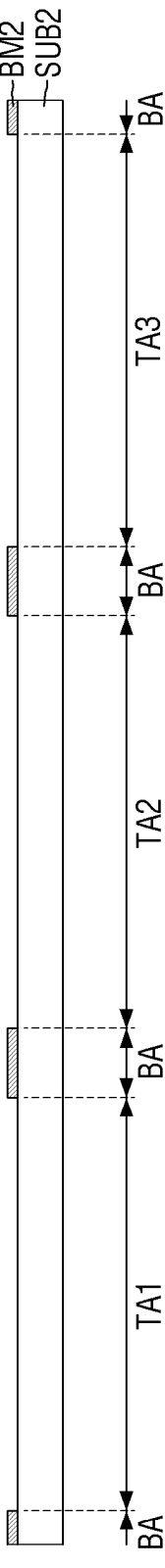

Referring to FIG. 15, the second substrate SUB2 may be prepared, and the second light blocking member BM2 may be formed on a surface of the second substrate SUB2. The second light blocking member BM2 may be formed in a lattice pattern so that portions of the surface of the second substrate SUB2 may be exposed. The second substrate SUB2 may be divided into the light blocking areas BA in which the second light blocking member BM2 is disposed and the light transmitting areas TA1. TA2, and TA3 in which a surface of the second substrate SUB2 is exposed. The second light blocking member BM2 may be formed by a process of applying a photosensitive organic material and exposing and developing the photosensitive organic material, similar to the first light blocking member BM1.

Figure 16:
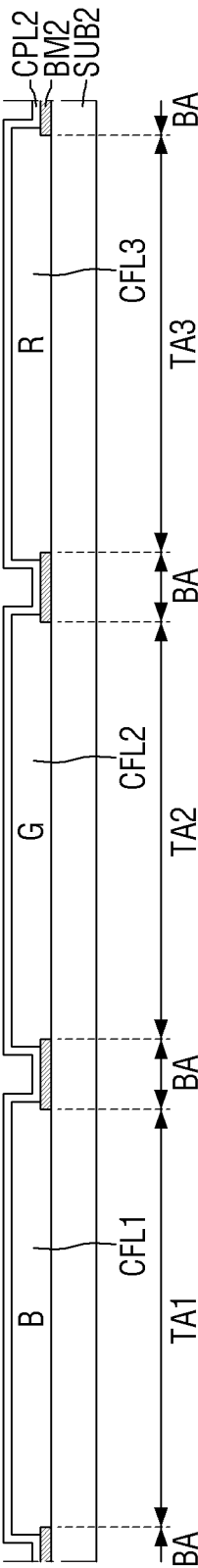

Referring to FIG. 16, the color filter layers CFL may be formed in the light transmitting areas TA1, TA2, and TA3 exposed without the second light blocking members BM2, and the second capping layer CPL2 covering the color filter layers CFL and the second light blocking members BM2 may be formed. The first color filter layer CFL1 may be formed in the first light transmitting area TA1, the second color filter layer CFL2 may be formed in the second light transmitting area TA2, and the third color filter layer CFL3 may be formed in the third light transmitting area TA3. Each of the color filter layers CFL may be formed by a process of applying a photosensitive organic material including a color material of a specific color, and exposing and developing the photosensitive organic material. For example, the first color filter layer CFL1 may be formed by applying a photosensitive organic material including a blue color material and exposing and developing the photosensitive organic material, the second color filter layer CFL2 may be formed by applying a photosensitive organic material including a green color material and by exposing and developing the photosensitive organic material, and the third color filter layer CFL3 may be formed by applying a photosensitive organic material including a red color material and exposing and developing the photosensitive organic material. However, embodiments are not limited thereto.

For example, the respective color filter layers CFL1, CFL2, and CFL3 may be spaced apart from each other on the second light blocking member BM2. However, in some embodiments, the respective color filter layers CFL1, CFL2, and CFL3 may partially overlap each other on the second light blocking member BM2, such that any one color filter layer CFL1, CFL2, or CFL3 may be disposed on another adjacent color filter layer CFL1, CFL2, or CFL3.

A process of forming the color filter layer CFL may include a process of applying a photosensitive organic material and a process of exposing and developing the photosensitive organic material In the processes of manufacturing the display device 10 according to an embodiment, a process of forming the color filter layers CFL on the second substrate SUB2, which is separated from the first display substrate 100 on which the color control members TPL, WCL1, and WCL2 are formed, may be performed. Thus, the color control members TPL, WCL1, and WCL2 may be protected from being damaged in an exposing and developing process.

For example, the second capping layer CPL2 covering the color filter layers CFL and the second light blocking member BM2 may be formed. The second capping layer CPL2 may be formed by depositing a material of the second capping layer CPL2 on the second substrate SUB2, similar to the first capping layer CPL1.

The second display substrate 300 may be manufactured by the above processes. In case that the first display substrate 100 and the second display substrate 300 are manufactured, the display device 10 may be manufactured by performing a process of bonding the first display substrate 100 and the second display substrate 300 to each other by using the base layer SML.

Figure 17:
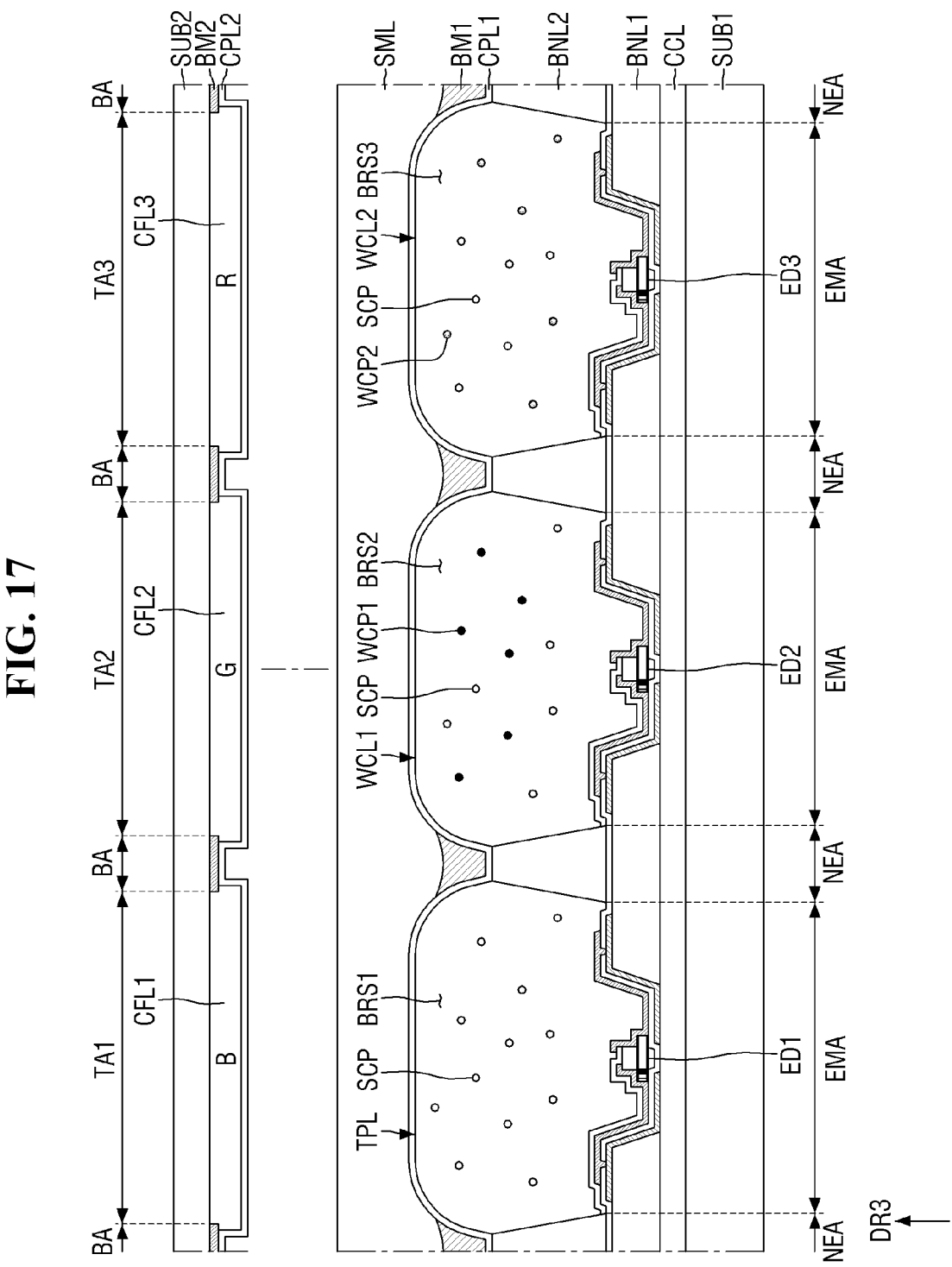

Referring to FIG. 17, the display device 10 may be manufactured by disposing the base layer SML between the first display substrate 100 and the second display substrate 300 and by bonding the first display substrate 100 and the second display substrate 300 to each other. The base layer SML may be prepared by applying an organic material onto any one display substrate, and may be adhered to the first display substrate 100 and the second display substrate 300 in a process of bonding the first display substrate 100 and the second display substrate 300 to each other A process of disposing the base layer SML on the first capping layer CPL1 and the first light blocking member BM1 of the first display substrate 100 and a process of bonding the first display substrate 100 to the second display substrate 300 are illustrated in the drawing, but embodiments are not limited thereto.

In the display device 10, the light efficiency and the color matching rate may be improved by disposing the light emitting elements ED and the color control members TPL, WCL1, and WCL2 together on the first substrate SUB1, and damage to the color control members TPL, WCL1, and WCL2 may be prevented by forming the color filter layers CFL on the second substrate SUB2.

Hereinafter, other embodiments of the display device 10 will be described with reference to other drawings.

Figure 18:
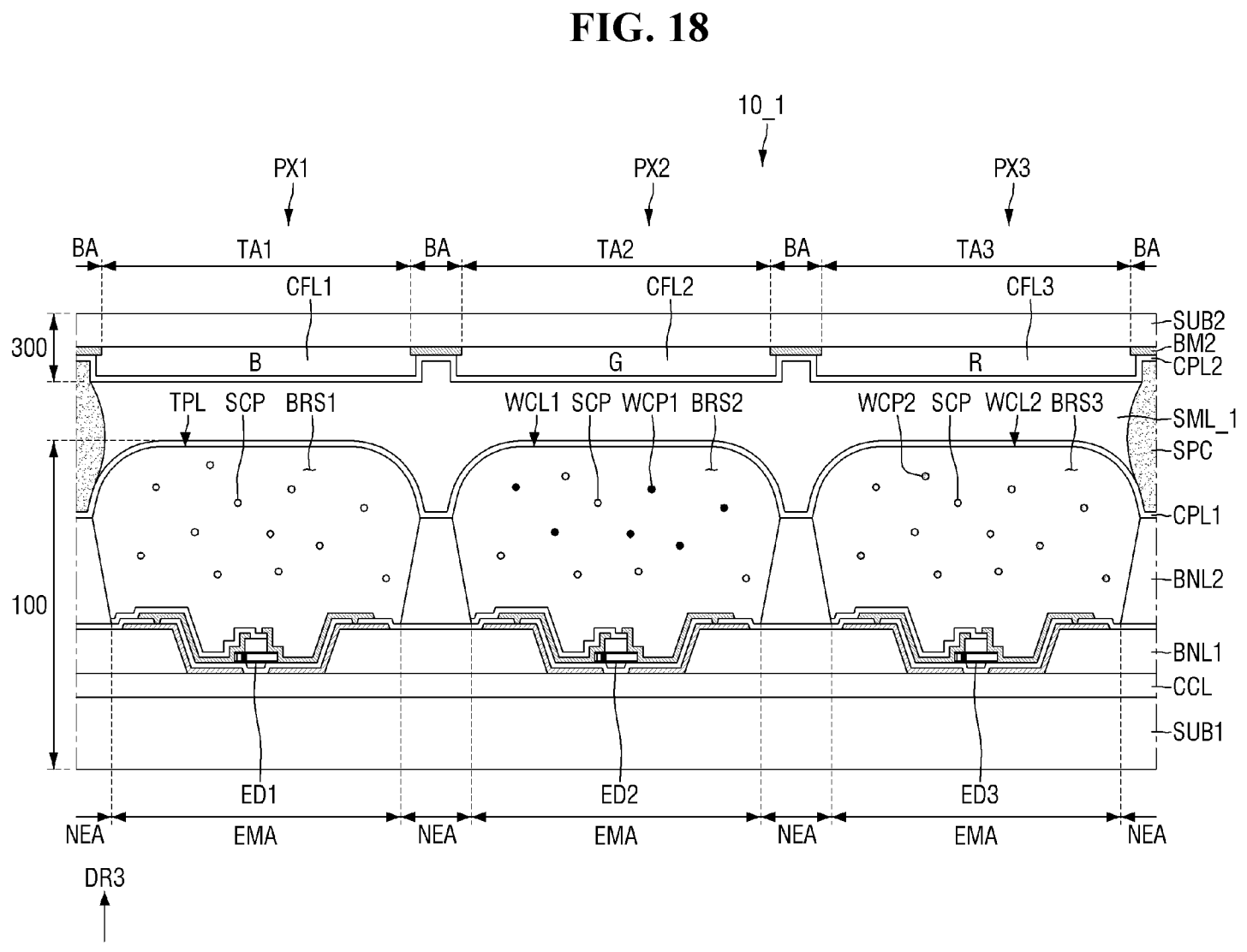

FIG. 18 is a schematic cross-sectional view illustrating a pixel of a display device according to an embodiment.

Referring to FIG. 18, in a display device 10_1 according to an embodiment, a base layer SML_1 may include a low refractive material. A material of the base layer SML_1 of the display device 10_1 may change, and accordingly, the display device 10_1 may further include a spacer SPC disposed between the first display substrate 100 and the second display substrate 300 to support the second display substrate 300. The base layer SML_1 may include the low refractive material, and accordingly, color mixing of light emitted from neighboring sub-pixels PXn may be prevented. Thus, the first light blocking member BM1 may be omitted. The embodiment is different from an embodiment of FIG. 4 in that the material of the base layer SML_1 is different and the display device further includes the spacer SPC. Hereinafter, a redundant description will be omitted for descriptive convenience, and the base layer SML_1 and the spacer SPC will be described in detail.

The base layer SML_1 may provide an optical path of light emitted from the light emitting elements ED or the color control members TPL, WCL1, and WCL2, and may fill a space between the first display substrate 100 and the second display substrate 300 between the first display substrate 100 and the second display substrate 300. The base layer SML_1 may include the low refractive material having a refractive index lower than that of the color control members TPL, WCL1, and WCL2 or the first capping layer CPL1. Thus, the occurrence of color mixing between other adjacent sub-pixels PXn may be decreased. Light passing through the color control members TPL, WCL1, and WCL2 may be incident on the color filter layers CFL of the second display substrate 300 through the base layer SML_1. The base layer SML_1 may include a material having a low refractive index, and accordingly, an amount of light incident to the color filter layers CFL corresponding to other sub-pixels PXn among light emitted from the color control members TPL, WCL1, and WCL2 of corresponding sub-pixels PXn may be decreased. For example, due to a difference in refractive index between the base layer SML_1 and the first capping layer CPL1, an amount of light totally reflected among the light emitted from the color control members TPL, WCL1, and WCL2 may be increased Thus, a light recycling effect may occur. For example, like the second sub-pixel PX2 and the third sub-pixel PX3, some of light emitted from the second light emitting elements ED2 and the third light emitting elements ED3 may be emitted from the wavelength conversion layers WCL1 and WCL2 without a change in color. The base layer SML_1 may include the low refractive material, and accordingly, an amount of light emitted and recycled from the wavelength conversion layers WCL1 and WCL2 may be increased and light efficiency and color purity may be further improved.

The spacer SPC may be disposed in order to prevent the second display substrate 300 from sagging (or bending) due to the change in the material of the base layer SML_1. According to an embodiment, the spacer SPC may overlap the second bank BNL2 of the first display substrate 100 or the second light blocking member BM2 of the second display substrate 300 in the thickness direction. For example, the first light blocking member BM1 may be omitted. Thus, the spacer SPC may be disposed in the valley areas between the color control members TPL, WCL1, and WCL2 on the first capping layer CPL1. A lower surface of the spacer SPC may be in contact with the first capping layer CPL1, and an upper surface of the spacer SPC may be in contact with the second capping layer CPL2 The spacer SPC may prevent the second display substrate 300 from partially sagging (or partially bending) due to the base layer SML_1 including the low refractive material, and may maintain a distance between the first display substrate 100 and the second display substrate 300.

Unlike the first light blocking member BML, the spacer SPC may not be disposed at each of the boundary areas between the respective sub-pixel PXn, but may be disposed at every plural sub-pixels PXn. As an example, the spacer SPC may be disposed at every three sub-pixels PXn or a single pixel PX. The spacer SPC may be disposed in valley portions of the color control members TPL, WCL1, and WCL2 at the boundary areas between the pixels PX in plan view. The spacer SPC may be made of an organic material, an inorganic material, or the like. For example, the spacer SPC may be made of an organic material such as a photoresist, a polyacrylic resin, a polyimide resin, or an acrylic resin.

As the color control members TPL, WCL1, and WCL2 are disposed adjacent to the light emitting elements ED, most of the light emitted from the light emitting elements ED may be incident. Thus, light efficiency may be improved. For example, as the wavelength conversion layers WCL1 and WCL2 are disposed adjacent to the light emitting elements ED emitting the light of the first color, light conversion efficiency may be improved, and emission of light of colors other than a desired color may be prevented. However, in a case of the light transmitting layer TPL, even though the light transmitting layer TPL is not disposed adjacent to the light emitting elements ED, light conversion efficiency may not be considered. For example, even though a distance between the light transmitting layer TPL and the light emitting elements ED is great, light efficiency, a color matching rate, and the like, may be excellent in the corresponding sub-pixel PXn. According to an embodiment, the light transmitting layer TPL may be disposed on a surface of the second display substrate 300 rather than the first display substrate 100, and the base layer SML may be disposed on the light emitting elements ED in the first sub-pixel PX1 of the first display substrate 100.

Figure 19:
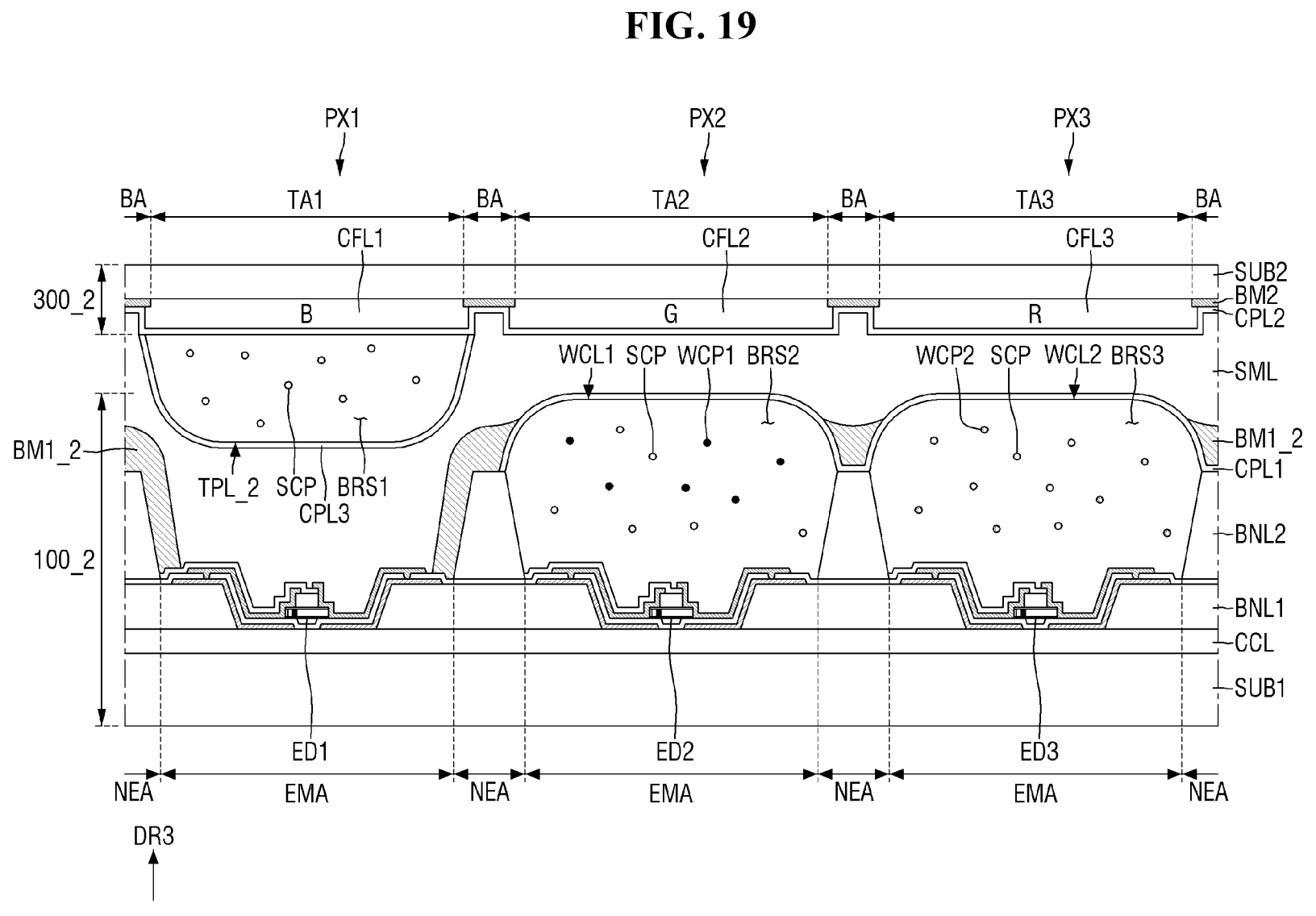
Figure 20:
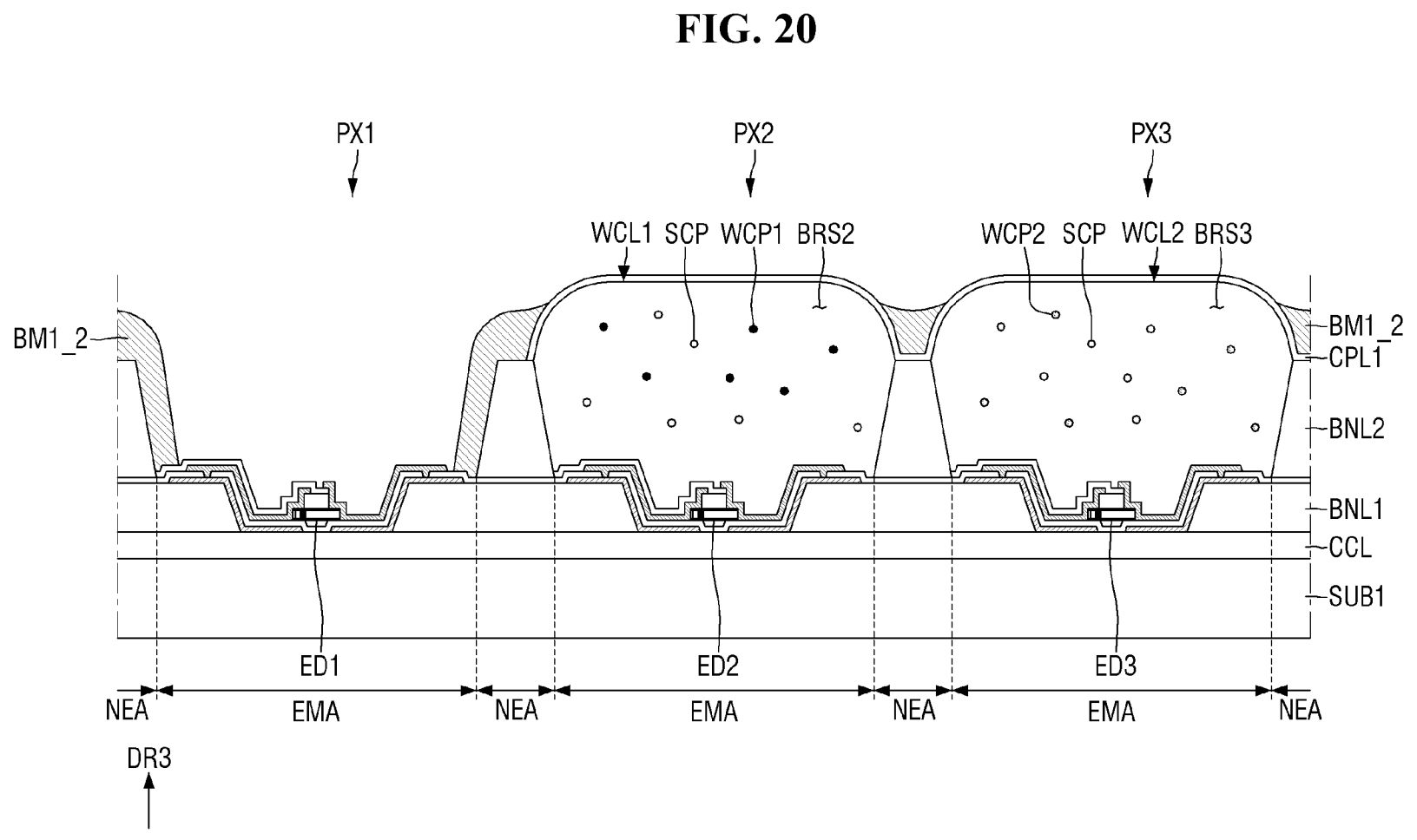
Figure 21:
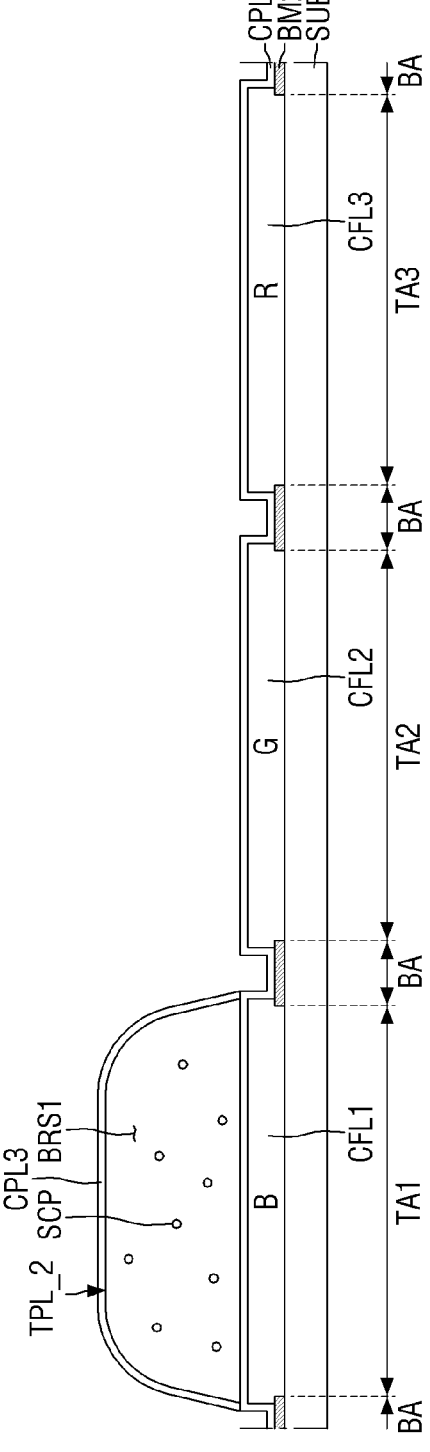
Figure 22:
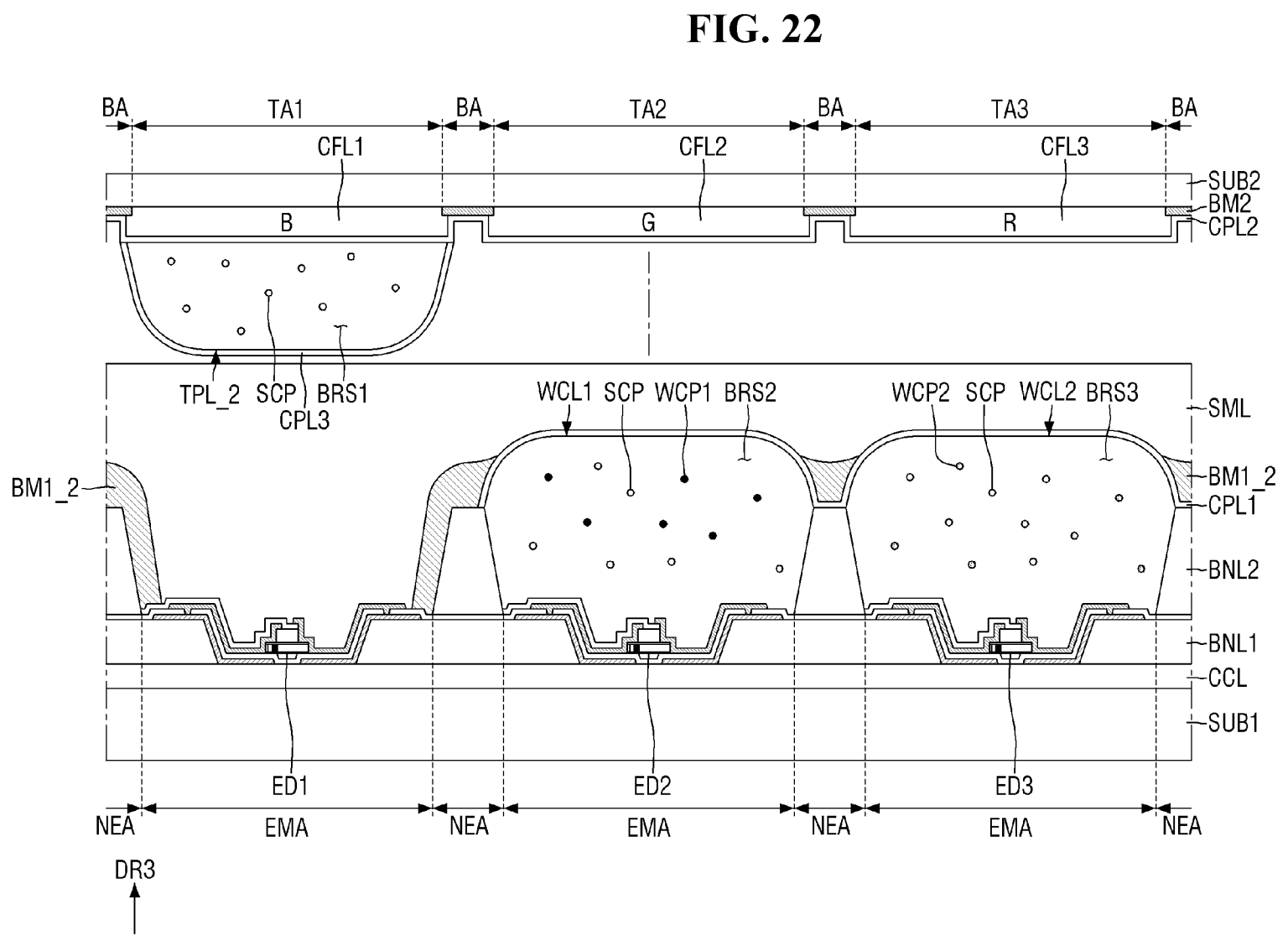

FIG. 19 is a schematic cross-sectional view illustrating a pixel of a display device according to an embodiment. FIGS. 20 to 22 are cross-sectional views sequentially illustrating some of processes of manufacturing the display device of FIG. 19. FIGS. 20 to 22 illustrate a process of forming color control members TPL_2, WCL1, and WCL2 and a process of bonding a first display substrate 100_2 and a second display substrate 300_2 to each other.

Referring to FIGS. 19 to 22, in a display device 10 according to an embodiment, a light transmitting layer TPL_2 may be disposed on a surface of the second display substrate 300_2. The light transmitting layer TPL_2 may be disposed on a surface of the first color filter layer CFL1 facing the first substrate SUB1, which is disposed in the first light transmitting area TA1 The light transmitting layer TPL_2 may not be disposed in a light emitting area EMA corresponding to a first sub-pixel PX1 of the first display substrate 100_2, and may be spaced apart from the first display substrate 100_2 by the base layer SML. In the first sub-pixel PX1, the base layer SML may be disposed (e.g., directly disposed) in an area surrounded by the second bank BNL2. The embodiment is different from an embodiment of FIG. 4 in the display substrates 100_2 and 300_2 on which the light transmitting layer TPL_2 is disposed Hereinafter, a redundant description will be omitted for descriptive convenience, and contents different from those described above will be described.

As in an embodiment of FIG. 4, the wavelength conversion layers WCL1 and WCL2 may be disposed in light emitting areas EMA of a second sub-pixel PX2 and a third sub-pixel PX3 of sub-pixels PXn of the first display substrate 100_2, respectively. For example, the light transmitting layer TPL_2 may not be disposed in the light emitting area EMA of the first sub-pixel PX1. In the process of forming the color control members TPL, WCL1, and WCL2 of the first display substrate 100_2, the first wavelength conversion layer WCL1 and the second wavelength conversion layer WCL2 may be formed, and the light transmitting layer TPL_2 may not be formed. The first capping layer CPL1 may surround the wavelength conversion layers WCL1 and WCL2, but may not be disposed on the first sub-pixel PX1. The first capping layer CPL1 may be partially disposed on the second bank BNL2 at a boundary area with the first sub-pixel PX1.

A first light blocking member BM1 disposed at a boundary area between the first sub-pixel PX1 and another adjacent sub-pixel PXn may be partially disposed in the light emitting area EMA of the first sub-pixel PX1 Since the light transmitting layer TPL_2 is not disposed in the light emitting area EMA of the first sub-pixel PX1, the first light blocking member BM1 may be disposed (e.g., directly disposed) on the first insulating layer PAS1 of the first sub-pixel PX1. For example, the base layer SML may be disposed in an area in which the light transmitting layer TPL_2 is not disposed. The base layer SML may be in contact with (e.g., in direct contact with) some of the insulating layers PAS1, PAS2, and PAS3 on the first light emitting elements ED1.

The light transmitting layer TPL_2 may be disposed on the second display substrate 300_2. The light transmitting layer TPL_2 may be disposed in the first light transmitting area TA1 corresponding to the first sub-pixel PX1, and may be disposed on a surface of the first color filter layer CFL1, e.g., a surface of the first color filter layer CFL1 facing the first substrate SUB1. In an embodiment, the second capping layer CPL2 may be disposed between the first color filter layer CFL1 and the light transmitting layer TPL_2, and the light transmitting layer TPL_2 may be disposed (e.g., directly disposed) on a surface of the second capping layer CPL2. The second display substrate 300_2 may further include a third capping layer CPL3 for protecting the light transmitting layer TPL_2, and the third capping layer CPL3 may be disposed on the light transmitting layer TPL_2 so as to correspond to the first light transmitting area TA1. During processes of manufacturing the second display substrate 300_2, a process of forming the light transmitting layer TPL_2 in the first light transmitting area TA1 may be further performed after the second capping layer CPL2 is formed. In an embodiment, the light transmitting layer TPL_2 may also be formed by a photoresist process, and even though separate second banks BNL2 are not disposed in light blocking areas BA of the second display substrate 3002, the light transmitting layer TPL_2 may be selectively formed in the first light transmitting area TA1.

The first display substrate 100_2, on which the light transmitting layer TPL_2 is not formed, may be bonded to the second display substrate 300_2, on which the light transmitting layer TPL_2 is formed, through the base layer SML. Since the base layer SML includes the organic material, even though a step is formed by the light transmitting layer TPL_2 of the second display substrate 300_2, the first display substrate 100_2 and the second display substrate 300_2 may be smoothly bonded to each other.

Figure 23:
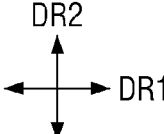
FIG. 23 is a schematic plan view illustrating a pixel of a first display substrate according to an embodiment.
Figure 24:
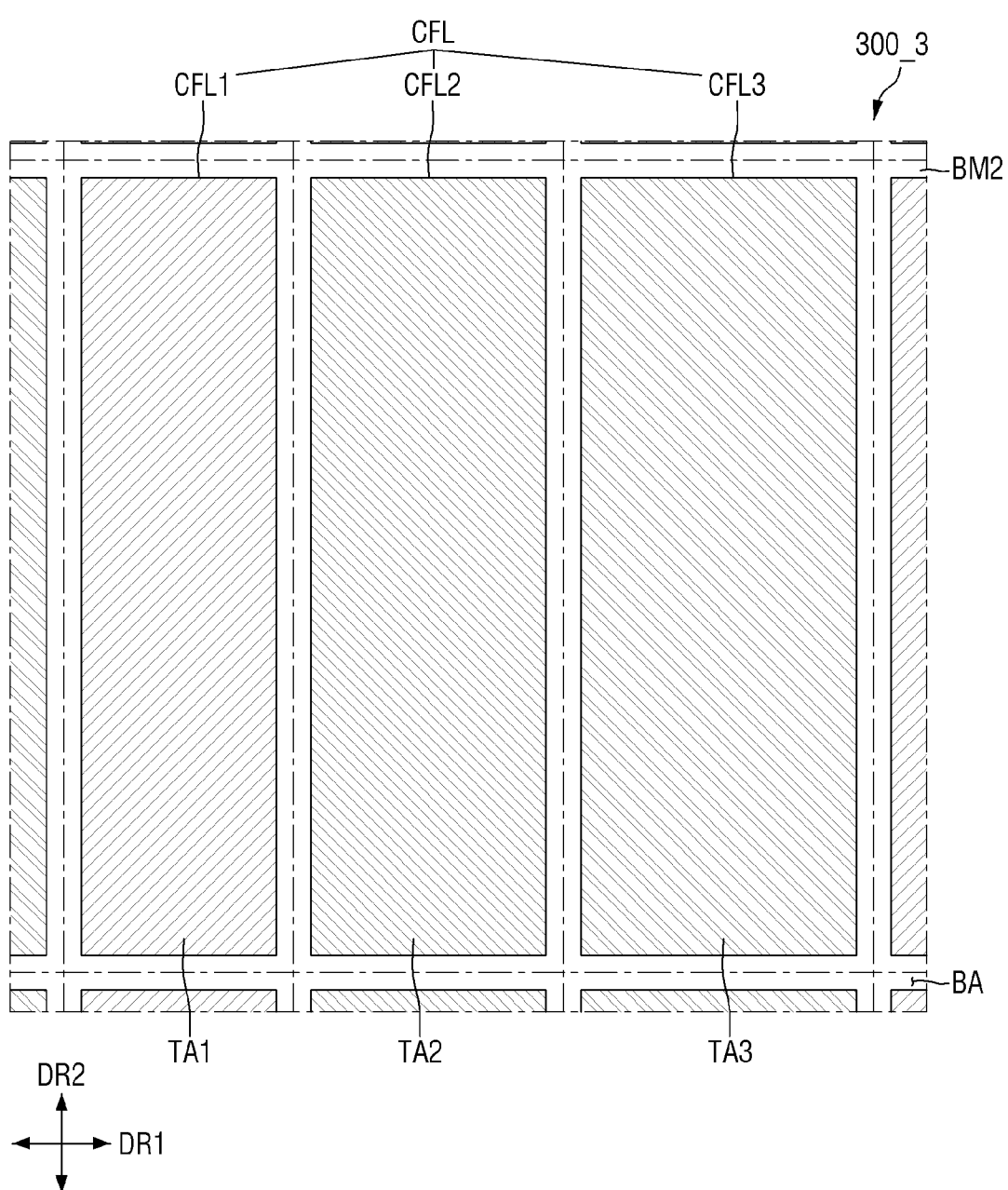
FIG. 24 is a schematic plan view illustrating a pixel of a first display substrate according to an embodiment.

FIG. 23 is a schematic plan view illustrating a pixel of a first display substrate according to an embodiment. FIG. 24 is a schematic plan view illustrating a pixel of a first display substrate according to an embodiment.

Referring to FIGS. 23 and 24, in a display device 10, areas of a first sub-pixel PX1, a second sub-pixel PX2, and a third sub-pixel PX3 displaying different colors may be different from each other In a second display substrate 300_3, light may be emitted to a surface of a second substrate SUB2, and at the same time, external light may be incident on the surface of the second substrate SUB2. Light incident from the outside may be reflected and emitted to the surface of the second substrate SUB2, and the reflected external light may be recognized by a user and may decrease display quality due to vision hindrance (or vision interruption). In order to improve the display quality of the display device 10, areas of color filter layers CFL of the second display substrate 300_3 of the display device 10 may be different from each other according to color materials included in the color filter layers CFL. Thus, areas of light emitting areas EMA of a first display substrate 100_3 may be different from each other.

For example, a third color filter layer CFL3 including a red color material may be disposed in the third sub-pixel PX3, and a third light transmitting area TA3 of the third sub-pixel PX3 may have an area greater than those of a first light transmitting area TA1 and a second light transmitting area TA2. For example, a second color filter layer CFL2 including a green color material may be disposed in the second sub-pixel PX2, and the second light transmitting area TA2 of the second sub-pixel PX2 may have an area greater than that of the first light transmitting area TAL. For example, in the first display substrate 100_3, an area of a light emitting area EMA of the third sub-pixel PX3 may be greater than areas of light emitting areas EMA of the second sub-pixel PX2 and the first sub-pixel PX1, and an area of the light emitting area EMA of the second sub-pixel PX2 may be greater than an area of the light emitting area EMA of the first sub-pixel PX1. It is illustrated in FIGS. 23 and 24 that the area of the third sub-pixel PX3 in which the third color filter layer CFL3 including the red color material is disposed is the greatest, but embodiments are not limited thereto. In some embodiments, the area of the second sub-pixel PX2 or the first sub-pixel PX1 may be the greatest. In an embodiment, by designing the areas of the respective sub-pixels PXn to be different from each other, deterioration of display quality due to external light reflection of the display device 10 may be prevented.

As described above, in the display device 10 according to an embodiment, the color control members TPL, WCL1, and WCL2 may be formed by an inkjet printing process. The color control members TPL, WCL1, and WCL2 may be formed by a process of jetting ink for forming the color control members TPL, WCL1, and WCL2 into the areas surrounded by the second bank BNL2 and a process of drying the ink In some embodiments, an inkjet printing process for forming the color control members TPL, WCL1, and WCL2 may be performed after other banks disposed on the second bank BNL2 are further formed. Accordingly, the first light blocking member BM1 may be omitted from the manufactured display device 10, and the manufactured display device 10 may further include other banks.

Figure 25:
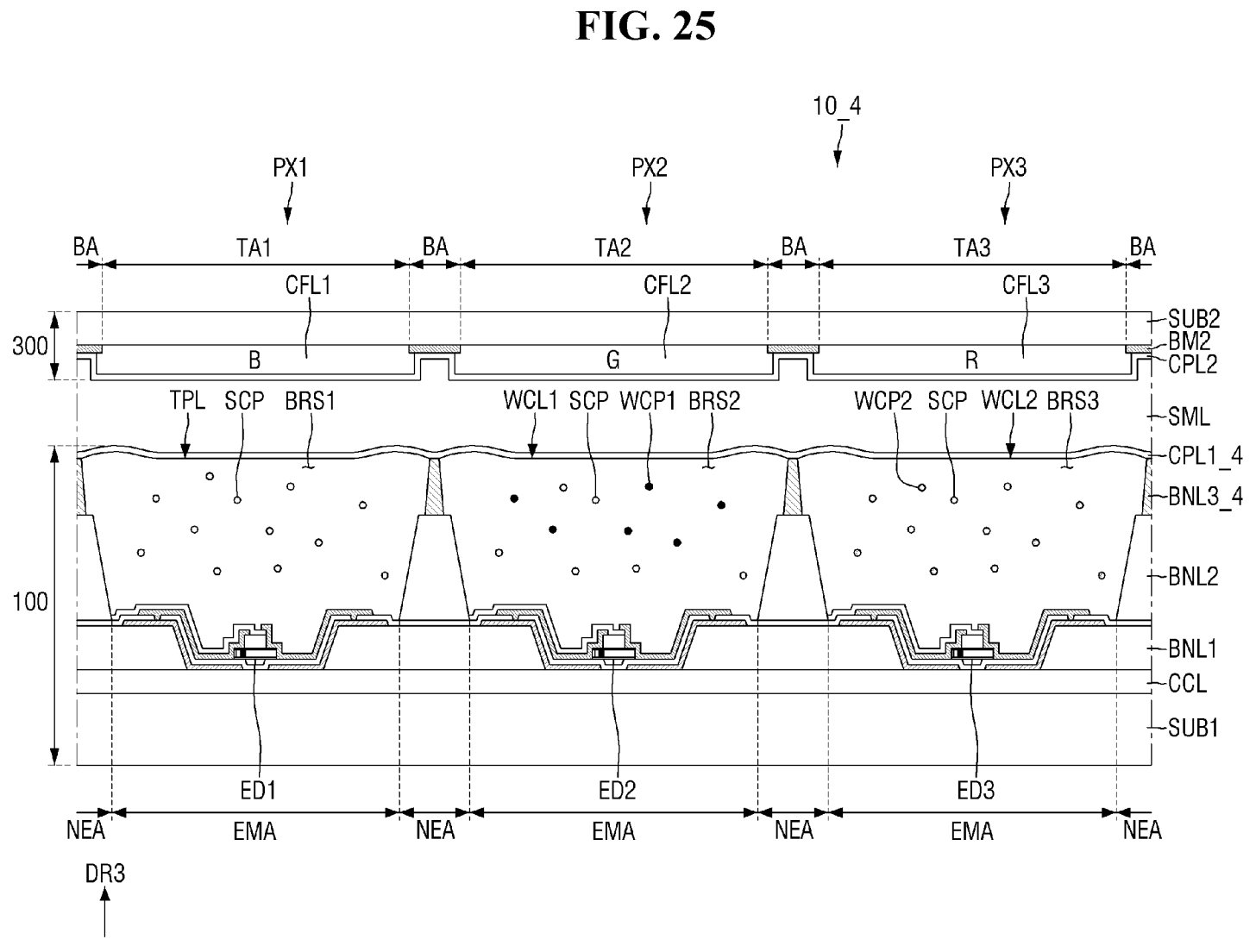

FIG. 25 is a schematic cross-sectional view illustrating a pixel of a display device according to an embodiment.

Referring to FIG. 25, a display device 104 according to an embodiment further may include a third bank BNL3_4 disposed on the second bank BNL2, and the color control members TPL, WCL1, and WCL2 may be disposed in areas surrounded by the second bank BNL2 and the third bank BNL3_4. The third bank BNL3_4 may prevent jetted ink from overflowing into other neighboring sub-pixels PXn in an inkjet process for forming the color control members TPL, WCL1, and WCL2. The display device 10_4 of FIG. 25 is different from the display device according to the above-described embodiment in that it further includes the third bank BNL3_4 disposed on the second bank BNL2. Thus, the color control members TPL, WCL1, and WCL2 may be formed by an inkjet printing process. Hereinafter, redundant contents will be omitted for descriptive convenience, and contents different from those described above will be described.

The third bank BNL3_4 may be disposed (e.g., directly disposed) on the second bank BNL2. The third bank BNL3_4 may extend in the first direction DR1 and the second direction DR2, similar to the second bank BNL2 in plan view, and may be disposed at boundary areas between the respective sub-pixels PXn. A width of a lower surface of the third bank BNL3_4 may be smaller than a width of an upper surface of the second bank BNL2. Side surfaces (e.g., opposite side surfaces) of the third bank BNL3_4 may be recessed inward as compared with side surfaces of the second bank BNL2 in cross-sectional view. However, embodiments are not limited thereto, and a width of the lower surface of the third bank BNL3_4 may be substantially the same as a width of the upper surface of the second bank BNL2. Thus, the side surfaces of the third bank BNL3_4 may be parallel to the side surfaces of the second bank BNL2.

In an embodiment, a height (or a thickness) of the third bank BNL3_4 may be smaller than that of the second bank BNL2. The third bank BNL3_4 may prevent the ink for forming the color control members TPL, WCL1, and WCL2 from overflowing, together with the second bank BNL2. Since the ink is jetted into the areas surrounded by the second bank BNL2, overflow of a certain amount of ink may be prevented by the second bank BNL2. The third bank BNL3_4 may have a height enough for jetted ink not to overflow in case that an amount of ink greater than an amount of ink, which is confined by the second bank BNL2, is jetted. For example, the height of the third bank BNL3_4 may change according to heights of the color control members TPL, WCL1, and WCL2.

The third bank BNL3_4 and the second bank BNL2 may include the same material. The third bank BNL3_4 and the second bank BNL2 may be formed in the same manner except for its shape. However, embodiments are not limited thereto, and in some embodiments, the third bank BNL3_4 and the first light blocking member BM1 may include the same material such that light emitted from light emitting elements ED of neighboring sub-pixels PXn may be blocked from transmitting toward other sub-pixels PXn. Accordingly, the first light blocking member BM1 may be omitted.

For example, side surfaces and at least a portion of an upper surface of the third bank BNL3_4 may be treated by a liquid repellent treatment. During processes of manufacturing the display device 10_4, the side surfaces and the upper surface or at least a portion of the upper surface of the third bank BNL3_4 may be treated by the liquid repellent treatment. Thus, overflow of ink may be effectively prevented.

The color control members TPL, WCL1, and WCL2 may be disposed in light emitting areas EMA among the areas surrounded by the second bank BNL2 and the third bank BNL3_4. In some embodiments, a height of the color control members TPL, WCL1, and WCL2 may be greater than a height of the third bank BNL3_4. The color control members TPL, WCL1, and WCL2 formed by the inkjet printing process may be formed by drying the ink jetted into each sub-pixel PXn. In a process of drying the ink, the color control members TPL, WCL1, and WCL2 may be formed at a greater height in portions in contact with the third bank BNL3_4 positioned at boundary areas with neighboring sub-pixels PXn, and may be formed at a relatively small height in central portions of the sub-pixels PXn spaced apart from the third bank BNL3_4. However, embodiments are not limited thereto, and a height of the color control members TPL, WCL1, and WCL2 may be substantially the same as a height of the third bank BNL3_4, and the color control members TPL, WCL1, and WCL2 may be formed so that upper surfaces thereof may be parallel to the upper surface of the third bank BNL3_4.

A first capping layer CPL1_4 may be disposed on the color control members TPL, WCL1, and WCL2 and the third bank BNL3_4. Unlike an embodiment of FIG. 4, the first capping layer CPL1_4 may cover the third bank BNL3_4, and a portion of a lower surface of the first capping layer CPL1_4 may be in contact with (e.g., in direct contact with) the third bank BNL3_4.

Figure 26:
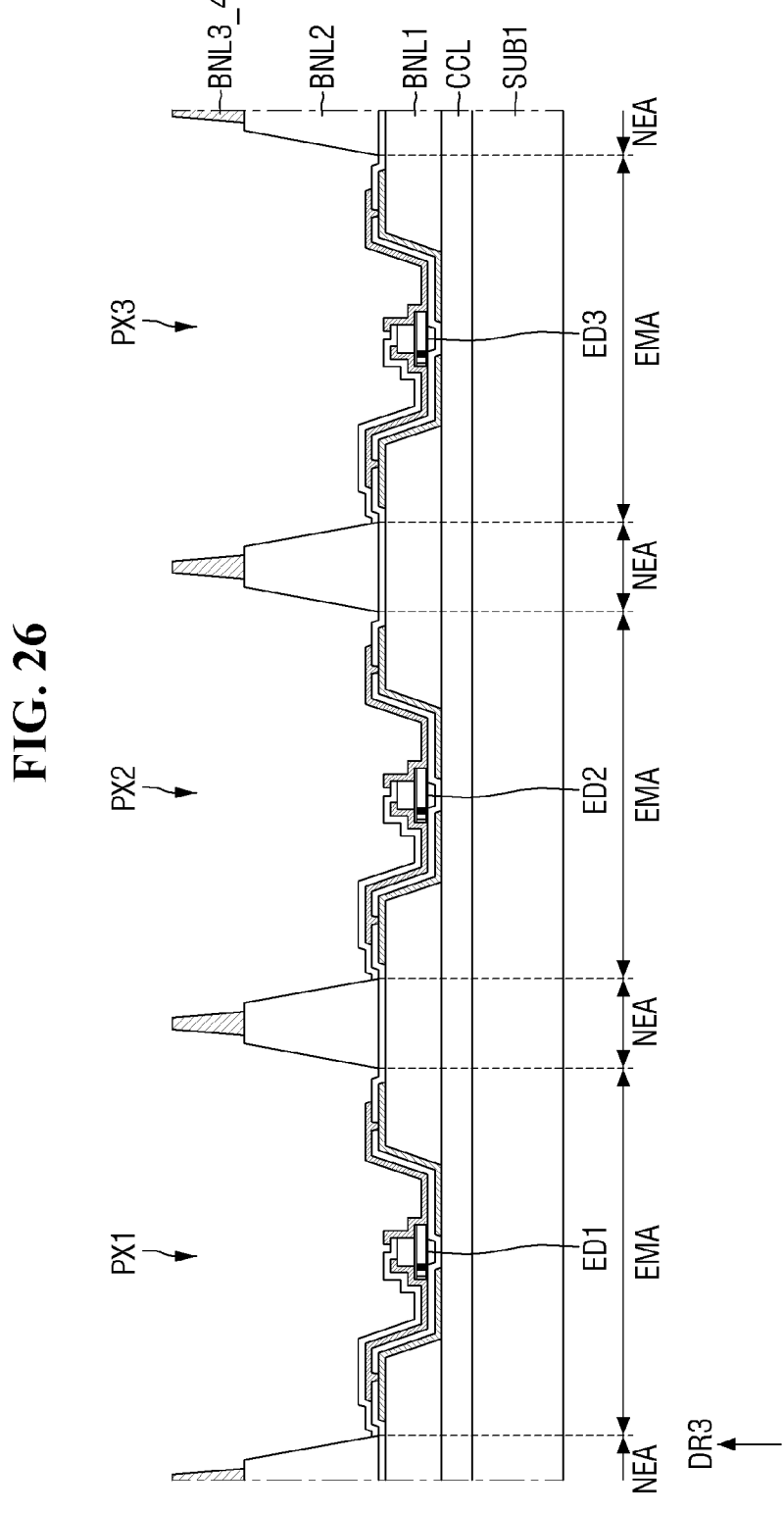
Figure 27:
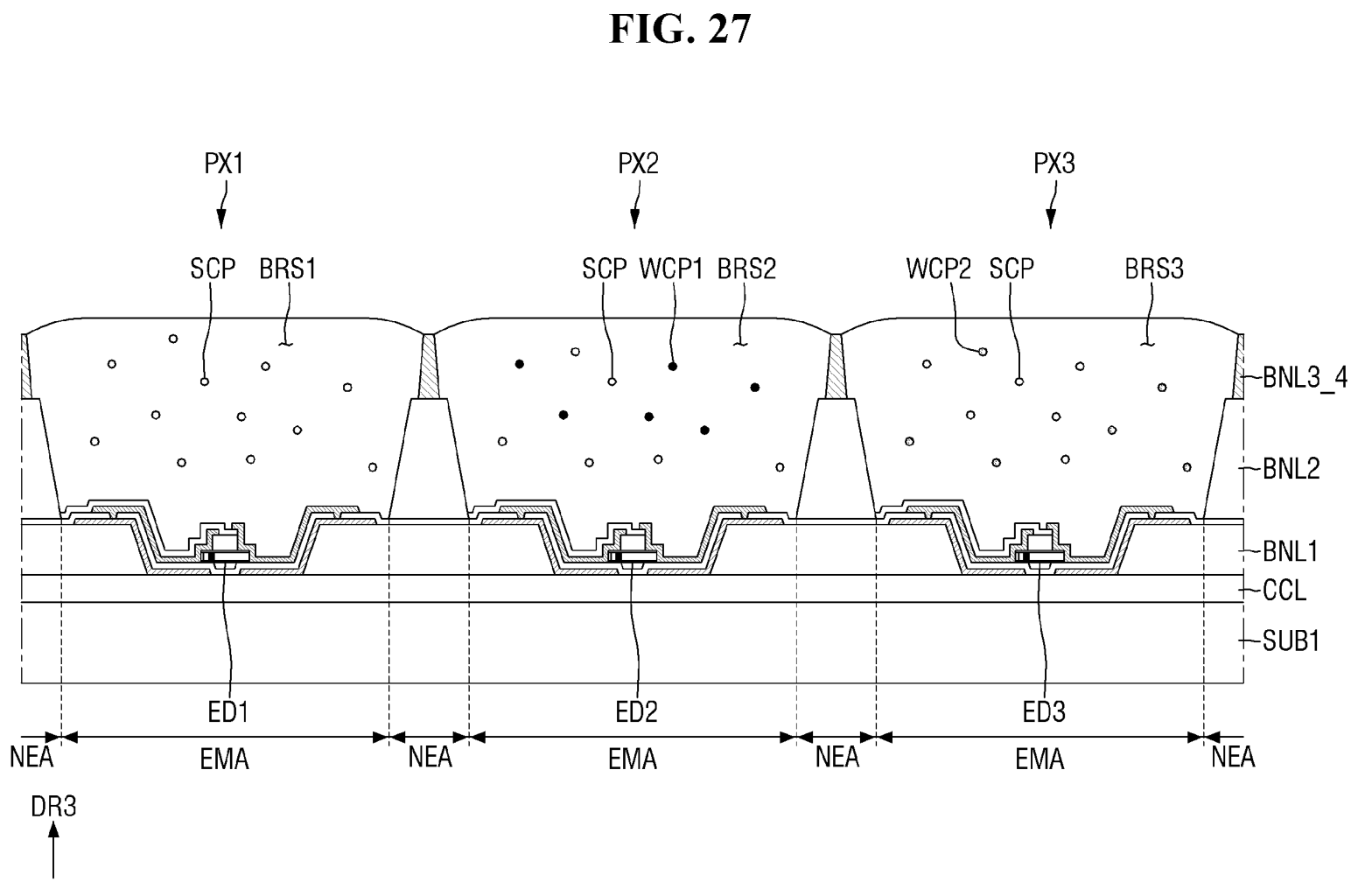

FIGS. 26 and 27 are schematic cross-sectional views sequentially illustrating some of processes of manufacturing the display device of FIG. 25.

Referring to FIGS. 26 and 27, processes of manufacturing the display device 10_4 may further include forming the third bank BNL3_4 on the second bank BNL2. The third bank BNL3_4 may be formed on the second bank BNL2 in a process before the light emitting elements ED are disposed or be formed on the second bank BNL2 in a process after the second contact electrode CNE2 is formed. In case that a process of forming the third bank BNL3_4 is performed before the inkjet printing process for forming the color control members TPL, WCL1, and WCL2, the order of the process is not limited.

The color control members TPL, WCL1, and WCL2 may be formed in the areas surrounded by the second bank BNL2 and the third bank BNL3_4 through the inkjet printing process. The inkjet printing process may be performed in a manner of jetting the base resins BRS1, BRS2, and BRS3 including the scatterers SCP or the wavelength conversion material WCP1 and WCP2. In addition to the second bank BNL2, the third bank BNL3_4 may prevent the base resins BRS1, BRS2, and BRS3 from overflowing into other neighboring sub-pixels PXn. As described above, in case that the side surfaces and the upper surface of the third bank BNL3_4 are subjected to the liquid repellent treatment, the overflow of the base resins BRS1, BRS2, and BRS3 may be more effectively prevented. For example, different color control members TPL, WCL1, and WCL2 may be formed for each sub-pixel PXn by drying the base resins BRS1, BRS2, and BRS3. In an embodiment, the display device 10_4 may further include the third banks BNL3_4, such that the inkjet printing process may be performed as a process of forming the color control members TPL, WCL1, and WCL2, and the display device 10 having the same effects as embodiments may be manufactured by various process methods.

Figure 28:
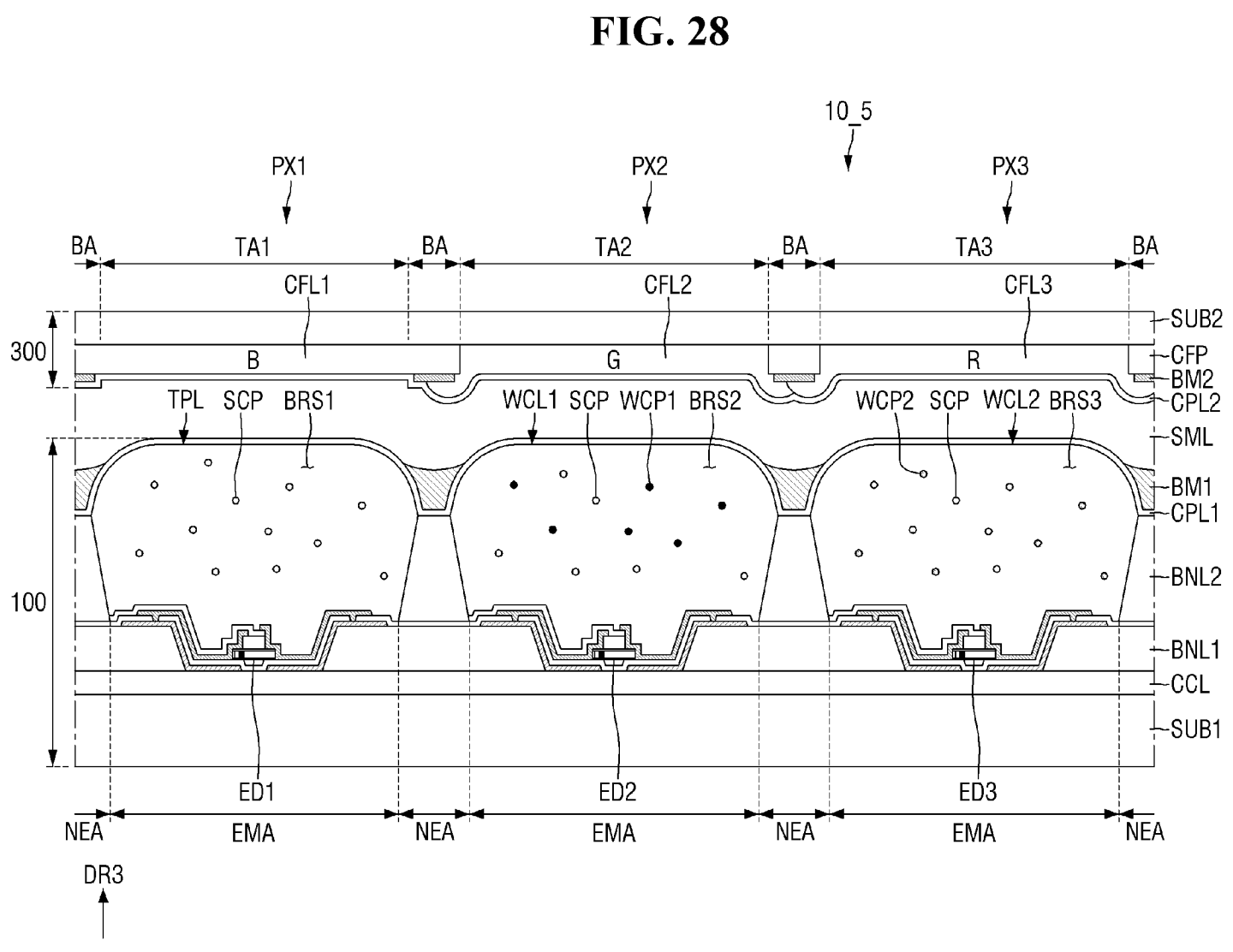
Figure 29:
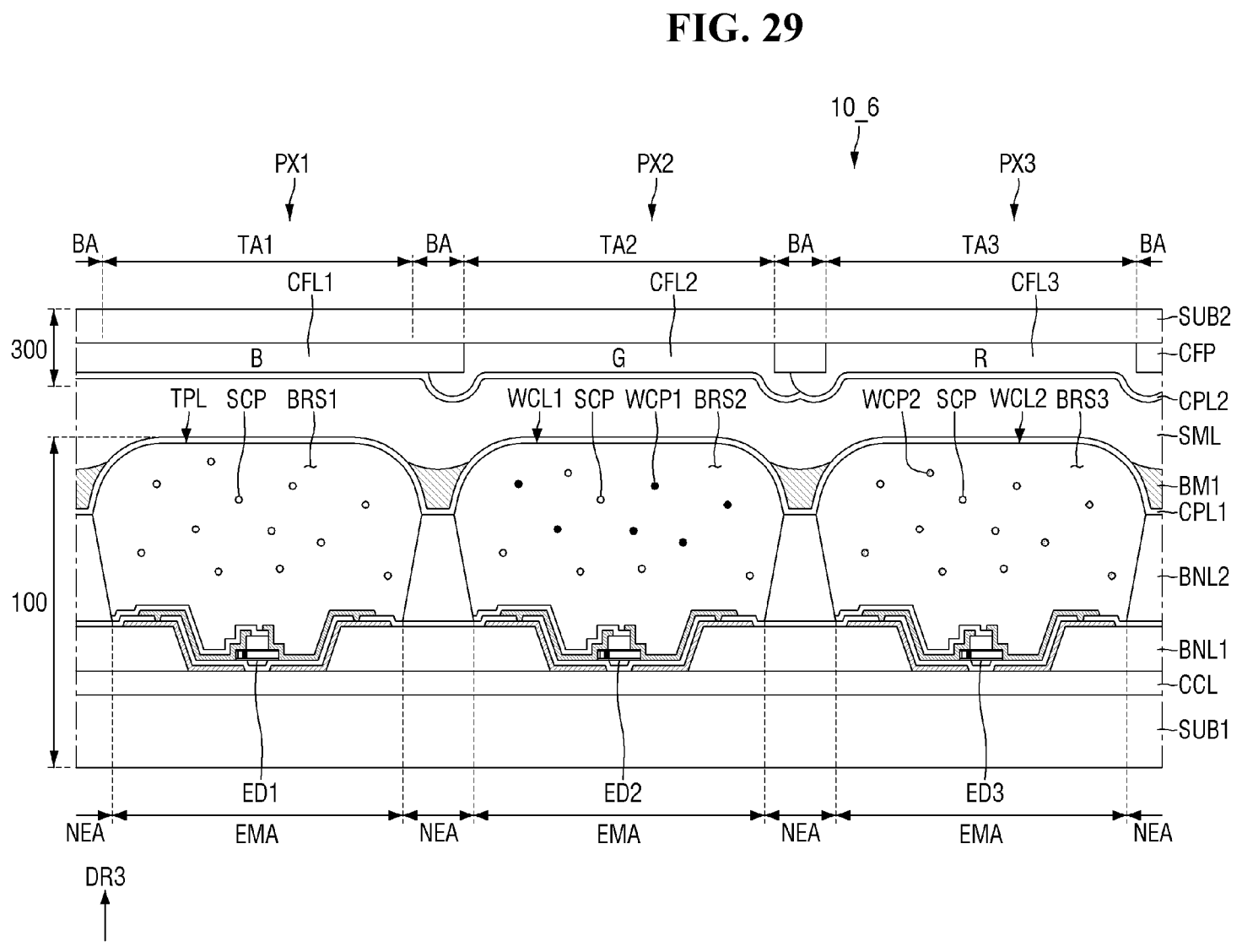

FIGS. 28 and 29 are schematic cross-sectional views illustrating a pixel of a display device according to an embodiment.

Referring to FIGS. 28 and 29, in display devices 10_5 and 10_6 according to an embodiment, a portion of the first color filter layer CFL1 may be disposed in the light blocking area BA or a color pattern layer CFP including the same color material as that of the first color filter layer CFL1 may be disposed in the light blocking area BA. In the light blocking areas BA, color filter layers CFL1, CFL2, and CFL3 may overlap each other or at least one of the color pattern layer CFP, the second color filter layer CFL2, and the third color filter layer CFL3 may overlap each other. The color filter layers CFL1, CFL2, and CFL3 may include dyes of different colors, respectively, and as the color filter layers CFL1, CFL2, and CFL3 are stacked, transmission of light may be blocked. In the display device 10_5 of FIG. 28, the second light blocking member BM2 may be disposed on the first color filter layer CFL1 or the color pattern layer CFP disposed in the light blocking area BA, and in the display device 10_6 of FIG. 29, the second light blocking member BM2 is omitted, and at least one of the second color filter layer CFL2 and the third color filter layer CFL3 may overlap the first color filter layer CFL1 or the color pattern layer CFP. An embodiment of FIG. 29 is different from an embodiment of FIG. 28 in that the second light blocking member BM2 is omitted. Hereinafter, a configuration of an embodiment of FIG. 28 will be described.

The first color filter layer CFL1 (or the color pattern layer CFP) may be disposed in the light blocking area BA of the second substrate SUB2. The first color filter layer CFL1 may be disposed in a portion of the light blocking area BA as well as above the light transmitting layer TPL so as to correspond to the first sub-pixel PX1. For example, in the light blocking area BA adjacent to the first light transmitting area TA1, the first color filter layer CFL1 may extend to have a greater width. The color pattern layer CFP may be disposed in the light blocking areas BA adjacent to the second light transmitting area TA2 and the third light transmitting area TA3 The color pattern layer CFP and the first color filter layer CFL1 may include the same material. The color pattern layer CFP may be formed together with the first color filter layer CFL1 in a single process.

The second light blocking member BM2 may be disposed on the first color filter layer CFL1 (or the color pattern layer CFP) disposed in the light blocking area BA. The second light blocking member BM2 may be disposed in the same manner as that of an embodiment of FIG. 4 except that the second light blocking member BM2 is disposed in the light blocking area BA of the second substrate SUB2 with the first color filter layer CFL1 (or the color pattern layer CFP) interposed therebetween.

At least one of the second color filter layer CFL2 and the third color filter layer CFL3 may be disposed on the first color filter layer CFL1 or the color pattern layer CFP disposed in the light blocking area BA. The second color filter layer CFL2 and the third color filter layer CFL3 may include dyes having colors different from that of the first color filter layer CFL1, respectively, and accordingly, transmission of light may be blocked in portions in which the second color filter layer CFL2 and the third color filter layer CFL3 are stacked.

In an embodiment in which the first color filter layer CFL1 includes a blue color material, external light or reflected light transmitted through the light blocking area BA may have a blue wavelength band. An eye color sensibility perceived by user's eyes may be different according to a color of light, and light of a blue wavelength band may be perceived less sensitively by a user than light of a green wavelength band and light of a red wavelength band. By stacking and displaying the color filter layers CFL1, CFL2, and CFL3 or the color pattern layer CFP in the light blocking areas BA, the user may perceive the reflected light relatively less sensitively with blocking transmission of the light, and to absorb some of light introduced from the outside of the display devices 10_5 and 10_6 to reduce the reflected light by the external light.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

The invention claimed is:

1. A display device comprising:
   a first substrate including a plurality of sub-pixels including light emitting areas;
   a plurality of first electrodes and a plurality of second electrodes disposed on the first substrate and spaced apart from each other;
   a plurality of light emitting elements disposed on the first substrate and disposed on the plurality of first electrodes and the plurality of second electrodes in the light emitting areas of the plurality of sub-pixels;

a color control member disposed on the plurality of light emitting elements and including a plurality of light transmitting layers and a plurality of wavelength conversion layers;

a second substrate facing the first substrate and including a plurality of light transmitting areas overlapping the plurality of sub-pixels;

a plurality of color filter layers disposed on a surface of the second substrate facing the first substrate; and a base layer disposed between the first substrate and the second substrate and being entirely between at least the plurality of wavelength conversion layers and the plurality of color filter layers, wherein an uppermost surface of the color control member is closer to a bottom surface of the plurality of color filter layers than a lowermost surface of the base layer.

2. The display device of claim 1, wherein the plurality of light emitting elements include first light emitting elements disposed in a first sub-pixel and second light emitting elements disposed in a second sub-pixel, the color control member includes a light transmitting layer disposed on the first light emitting elements and a first wavelength conversion layer disposed on the second light emitting elements, and the plurality of color filter layers include a first color filter layer disposed on the light transmitting layer and a second color filter layer disposed on the first wavelength conversion layer.

3. The display device of claim 2, wherein the light transmitting layer is directly disposed on the first light emitting elements, the first wavelength conversion layer is directly disposed on the second light emitting elements, and the base layer is disposed between the light transmitting layer and the first color filter layer.

4. The display device of claim 2, further comprising:

a first capping layer disposed on the light transmitting layer and the first wavelength conversion layer; and a second capping layer disposed on a surface of the first color filter layer facing the first substrate and a surface of the second color filter layer facing the first substrate, wherein the base layer is in direct contact with the first capping layer and the second capping layer.

5. The display device of claim 4, further comprising:

a spacer disposed at a boundary area between some of the plurality of sub-pixels and disposed between the first substrate and the second substrate, wherein the base layer includes a low refractive material having a refractive index lower than a refractive index of the first capping layer.

6. The display device of claim 5, wherein the spacer is in direct contact with the first capping layer and the second capping layer.

7. The display device of claim 2, wherein the light transmitting layer is disposed on a surface of the first color filter layer facing the first substrate, and the base layer is disposed between the light transmitting layer and the first light emitting elements.

8. The display device of claim 7, further comprising a third capping layer disposed on a surface of the light transmitting layer facing the first substrate.

9. The display device of claim 2, wherein the plurality of light emitting elements emit light of a first color, and the first wavelength conversion layer converts the light of the first color emitted from the plurality of light emitting elements into light of a second color different from the first color.

10. The display device of claim 9, wherein the plurality of light emitting elements further include third light emitting elements disposed in a third sub-pixel, the color control member further includes a second wavelength conversion layer directly disposed on the third light emitting elements, the color filter layers further include a third color filter layer disposed on the second wavelength conversion layer, and the second wavelength conversion layer converts the light emitted from the third light emitting elements into light of a third color different from the first color and the second color.

11. The display device of claim 1, further comprising:

a plurality of first banks disposed in boundary areas between the plurality of sub-pixels and disposed and spaced apart from each other in the light emitting areas; and a second bank disposed at the boundary areas between the plurality of sub-pixels and partially disposed on the plurality of first banks, wherein the plurality of first electrodes and the plurality of second electrodes are disposed on different first banks, respectively.

12. The display device of claim 11, further comprising:

a first light blocking member disposed between the plurality of light transmitting layers and the plurality of wavelength conversion layers; and a second light blocking member disposed on the surface of the second substrate and disposed between the plurality of color filter layers, wherein the first light blocking member and the second light blocking member overlap the second bank in a thickness direction.

13. The display device of claim 11, further comprising:

a third bank disposed on the second bank; and a first capping layer disposed on the third bank and the color control member.

14. The display device of claim 11, further comprising:

a first insulating layer disposed on the plurality of first electrodes and the plurality of second electrodes;

a first contact electrode in contact with end portions of the plurality of light emitting elements and the plurality of first electrodes; and a second contact electrode in contact with other end portions of the plurality of light emitting elements and the plurality of second electrodes, wherein the plurality of light emitting elements are directly disposed on the first insulating layer.

15. A display device comprising:

a first substrate including a plurality of sub-pixels including light emitting areas, the plurality of sub-pixels including a first sub-pixel and a second sub-pixel;

a first electrode and a second electrodes disposed in each of the plurality of sub-pixels on the first substrate and spaced apart from each other;

first light emitting elements disposed on the first electrode and the second electrode of the first sub-pixel and second light emitting elements disposed on the first electrode and the second electrode of the second sub-pixel;

a light transmitting layer directly disposed on the first light emitting elements and a first wavelength conversion layer directly disposed on the second light emitting elements;

a first capping layer covering the light transmitting layer and the first wavelength conversion layer;

a second substrate facing the first substrate and including a first light transmitting area overlapping the first sub-pixel and a second light transmitting area overlapping the second sub-pixel;

a first light blocking member disposed on a surface of the second substrate facing the first substrate and disposed between the first light transmitting area and the second light transmitting area;

a first color filter layer disposed on the surface of the second substrate in the first light transmitting area and a second color filter layer disposed on the surface of the second substrate in the second light transmitting area;

a second capping layer covering the first color filter layer, the second color filter layer, and the light blocking member;

a base layer disposed between the first capping layer and the second capping layer; and a spacer disposed at a boundary area between some of the plurality of sub-pixels and disposed to be in direct contact with the first capping layer and the second capping layer between the first substrate and the second substrate, wherein the base layer includes a low refractive material having a refractive index lower than a refractive index of the first capping layer.

16. The display device of claim 15, further comprising:

a plurality of first banks disposed in adjacent sub-pixels on the first substrate and spaced apart from each other in the light emitting areas; and a second bank disposed at a boundary area between the adjacent sub-pixels and surrounding the light emitting areas, wherein the light transmitting layer and the first wavelength conversion layer are disposed in areas surrounded by the second bank.

17. The display device of claim 16, wherein the first capping layer is directly disposed on the second bank.

18. The display device of claim 17, further comprising a second light blocking member directly disposed on a portion of the first capping layer disposed on the second bank and disposed between the light transmitting layer and the first wavelength conversion layer.

19. The display device of claim 16, wherein the second bank and the first light blocking member overlap each other in a thickness direction.

* * * * *